(12) United States Patent
Smith et al.

(10) Patent No.: US 11,293,853 B2
(45) Date of Patent: Apr. 5, 2022

(54) SYSTEM AND METHOD FOR MEASURING VIBRATIONAL SPECTRA IN LIVING CELLS AND TISSUE OVER TIME

(71) Applicant: Digital Harmonic LLC, Ellicott City, MD (US)

(72) Inventors: Paul Reed Smith, Annapolis, MD (US); William G. Nelson, Cockeysville, MD (US); Shane G. W. Morris, Baltimore, MD (US); Sandor Szalay, Baltimore, MD (US); Jonathan B. Coulter, Baltimore, MD (US); Frederick M. Slay, Okatie, SC (US); Eric K. Pritchard, Berkeley Springs, WV (US)

(73) Assignee: Digital Harmonic LLC, Ellicott City, MD (US)

( * ) Notice: Subject to any disclaimer, the term of this patent is extended or adjusted under 35 U.S.C. 154(b) by 0 days.

(21) Appl. No.: 16/565,855

(22) Filed: Sep. 10, 2019

(65) Prior Publication Data
US 2020/0064252 A1  Feb. 27, 2020

Related U.S. Application Data

(63) Continuation of application No. PCT/US2019/047880, filed on Aug. 23, 2019.
(Continued)

(51) Int. Cl.
*G01N 33/48* (2006.01)
*G01N 33/50* (2006.01)
(Continued)

(52) U.S. Cl.
CPC ..... *G01N 15/1484* (2013.01); *G01N 15/1459* (2013.01); *G01R 23/02* (2013.01);
(Continued)

(58) Field of Classification Search
CPC .......... G01N 15/1484; G01N 15/1459; G01N 2015/1493; G01N 2015/1486;
(Continued)

(56) References Cited

U.S. PATENT DOCUMENTS

| 3,761,187 A | 9/1973 | Dittrich et al. | |
| 4,453,181 A * | 6/1984 | Munakata | G01R 31/2656 348/126 |

(Continued)

FOREIGN PATENT DOCUMENTS

| CN | 106323447 A | 1/2017 |
| EP | 0980672 A1 | 2/2000 |

OTHER PUBLICATIONS

Pienta, K.J., et al., "Cellular Harmonic Information Transfer Through a Tissue Tensegrity-Matrix System," *Medical Hypotheses*, vol. 34, No. 1, 1991, pp. 88-95.
(Continued)

*Primary Examiner* — Russell S Negin
(74) *Attorney, Agent, or Firm* — Sterne, Kessler, Goldstein & Fox P.L.L.C.

(57) ABSTRACT

Disclosed are systems and methods for measuring vibrational spectra of a living cells and tissue that includes a low noise consistent optical source creating a photon beam, a support device, a photon-to-electron converter/detector outputting a streamed analog electrical signal, an analog-to-digital converter, and a digital signal processor with specialized software for measuring and characterizing the signal contained in the photon beam and its subsequent detector's streamed analog converted to digital signal. Motion of the living sample causes modulation to the photon beam as it passes through the living samples by how much of the
(Continued)

photon beam is blocked, absorbed or deflected. In addition, specific sub-cellular vibrational features can be segregated utilizing fluorescent markers.

21 Claims, 15 Drawing Sheets

Related U.S. Application Data

(60) Provisional application No. 62/722,302, filed on Aug. 24, 2018.

(51) Int. Cl.
| | | |
|---|---|---|
| *G01N 15/14* | (2006.01) | |
| *G06K 9/00* | (2022.01) | |
| *G01R 23/16* | (2006.01) | |
| *G01R 23/02* | (2006.01) | |

(52) U.S. Cl.
CPC ........... *G01R 23/16* (2013.01); *G06K 9/0053* (2013.01); *G01N 2015/1486* (2013.01); *G01N 2015/1493* (2013.01)

(58) Field of Classification Search
CPC ....... G01N 15/1434; G01N 2015/1006; G01N 15/1456; G06K 9/0053; G01R 23/16; G01R 23/02
See application file for complete search history.

(56) References Cited

U.S. PATENT DOCUMENTS

| | | | |
|---|---|---|---|
| 5,117,110 A * | 5/1992 | Yasutake | ............... G01Q 40/02 |
| | | | 250/491.1 |
| 6,766,288 B1 | 7/2004 | Smith | |
| 8,620,976 B2 | 12/2013 | Smith et al. | |
| 9,279,839 B2 | 3/2016 | Smith et al. | |
| 9,390,066 B2 | 7/2016 | Smith et al. | |
| 9,600,445 B2 | 3/2017 | Smith et al. | |
| 2009/0251706 A1 | 10/2009 | Rembe et al. | |

OTHER PUBLICATIONS

Myrdal, S.E., et al., "An Agent or Agents Produced by Virus-transformed Cells Cause Unregulated Ruffling in Untransformed Cells," *The Journal of Cell Biology*, vol. 102, No. 4, 1986, pp. 1224-1229.

Partin, A., et al., "Fourier Analysis of Cell Motility: Correlation of Motility with Metastatic Potential," *Proceedings of the National Academy of Sciences of the U.S.A.*, vol. 86, No. 4, 1989, pp. 1254-1258.

Vadalà, M., et al., "Mechanisms and Therapeutic Effectiveness of Pulsed Electromagnetic Field Therapy in Oncology," *Cancer Medicine*, vol. 5, No. 11, 2016, pp. 3128-3139.

Guo, F., et al., "Three-Dimensional Manipulation of Single Cells Using Surface Acoustic Waves," *Proceedings of the National Academy of Sciences of the U.S.A.*, vol. 113, No. 6, 2016, pp. 1522-1527.

Nelson, S.L., et al., "Vibrational Profiling of Brain Tumors and Cells," *Theranostics*, vol. 7, No. 9, 2017, pp. 2417-2430.

Ding, X., et al., "Cell Separation Using Tilted-Angle Standing Surface Acoustic Waves," *Proceedings of the National Academy of Sciences of the U.S.A.*, vol. 111, No. 36, 2014, pp. 12992-12997.

International Search Report and Written Opinion directed to related International Patent Application No. PCT/US/2019/047880, dated Dec. 2, 2019; 19 pages.

Jaross, W., "Are Molecular Vibration Patterns of Cell Structural Elements Used for Intracellular Signalling?" *The Open Biochemistry Journal*, vol. 10, No. 1, 2016, pp. 12-16.

Fitzgerald, M., "Vibrating Cells Disclose Their Ailments," *MIT Technology Review*, accessed at https://www.technologyreview.com/2008/09/09/33557/vibrating-cells-disclose-their-ailments/, published Sep. 9, 2008, 3 pages.

Fraldi et al., "A frequency-based hypothesis for mechanically targeting and selectively attacking cancer cells," *J.R. Soc. Interface*, 12(111):1-16 (Aug. 2015).

Holmes et al., "Synchronized mechanical oscillations at the cell—matrixinterface in the formation of tensile tissue," *Proceedings of the National Academy ofSciences ofthe United States of America*, 115(40):E9288-E9297 (Aug. 2018).

Jaganathan et al., "Naturalfrequency of cancer cells as a startingpoint in cancer treatment," *Current Science*, 110(9):1828-1832 (May 2016).

Medeiros et al., "An electrical method to measure low-frequency collectiveand synchronized cell activity using extracellular electrodes," *Sensing and Bio-sensing Research*, 10:1-8 (Jun. 2016).

Notbohm et al., "Cellular Contraction and Polarization Drive Collective Cellular Motion," *Biophysical Journal*, 110:2729-2738 (Jun. 2016).

Sanyour et al., Spontaneous oscillation in cell adhes ion and stiffness measured using atomic force microscopy, *Nature Scientific Reports*, 8:1-10 (Feb. 2018).

Park et al., "Refractive index maps and membrane dynamics of human red blood cells parasitized by Plasmodium falciparum," Proceedings of the National Academy of Sciences of the United States of America (PNAS), vol. 105, No. 37, 13730, dated Sep. 16, 2008, 6 pages.

* cited by examiner

SYSTEM AND METHOD FOR MEASURING VIBRATIONAL SPECTRA IN LIVING CELLS AND TISSUE OVER TIME

CROSS-REFERENCES TO RELATED APPLICATIONS

The present application claims the benefit and priority to PCT Application No. PCT/US2019/047880, filed Aug. 23, 2019, entitled "System and Method for Vibrational Spectra In Living Cells and Tissue Over Time," which claims the benefit and priority to U.S. Provisional Patent Application No. 62/722,302, filed Aug. 24, 2018, entitled "System and Method for Vibrational Spectra In Living Cells and Tissue Over Time," both of which are incorporated herein by reference in their entireties.

BACKGROUND OF THE INVENTION

Field

The invention relates to measuring of vibrational spectra, signals, and waveforms of living cells, living tissue and other biologic material.

Background

Prior methods to predict and/or measure the vibrational spectra produced by cells and living tissue include techniques of: time lapse photography/video paired with Fourier transforms, measuring single cells with flow cytometry that directs fluorescent and other kinds of light onto cell walls and examines the light scatter and molecular markers, measuring voltage changes via patch-clamping on to cell walls to measure changes in voltage across the cell wall, the treating of cells with pulsed electromagnetic fields, and treating cells with acoustic bombardment. Known prior techniques to acoustically analyze cells include the following:

1) Pienta, K. J., et al., "Cellular Harmonic Information Transfer Through a Tissue Tensegrity-Matrix System," *Medical Hypotheses*, vol. 34, no. 1, 1991, pp. 88-95. Pienta et al. summarize the known components of cellular movement (e.g., DNA vibration, membrane ruffling and undulation) and the attempts and technologies used within and outside the Coffey laboratory to measure these many forms of movement with time lapse video and fast Fourier transforms (FFTs). It was hypothesized that individual (e.g., cytoskeletal source) and/or integrated (tensegrity-mediated integration of nuclear matrix, cytoplasmic and cytoskeletal, cell membrane, and extracellular matrix components) vibrational wave propagation (i.e., sound) could serve as a communication conduit for integrating information transfer through a cell mediated harmonic waveform system.

2) Myrdal, S. E., et al., "An Agent or Agents Produced by Virus-transformed Cells Cause Unregulated Ruffling in Untransformed Cells," *The Journal of Cell Biology*, vol. 102, no. 4, 1986, pp. 1224-1229. Myrdal, et al. study how a particular form of movement—ruffling of free cell margins—changes in a quantitative manner in response to stimuli such as insulin and glucose. These studies were accomplished by conventional light microscopy-aided counting of percentages of normal rat kidney cells forming a ruffling phenotype over time following stimulation. The ruffling response time and characteristics showed that cells moved their free cell margins in response to insulin and glucose. The limitations of this technique include the labor-intensive nature of counting individual cells and the variability associated with individuals scoring ruffling behavior. The output also is restricted to a single type of movement. Nonetheless, the study demonstrated a cellular movement in response to physiologic stimuli.

3) Partin, A., et al., "Fourier Analysis of Cell Motility: Correlation of Motility with Metastatic Potential," *Proceedings of the National Academy of Sciences of the U.S.A.*, vol. 86, no. 4, 1989, pp. 1254-1258. Partin et al. describe a mathematical system that can be used to quantitate and describe cell motility resulting from numerous sources (e.g., undulation, ruffling) in individual cells over time. This spatial-temporal output was also used to correlate movement with metastatic potential in rat prostate cancer cells. In brief, low density cells were captured using video recording (through a Zeiss IM35 microscope) at intervals of wide time over longer time intervals. Once every 60 seconds they digitized the video image. Then a Fourier transform is run on each of the X Y coordinates for the one time per minute video image. Cell contours (outlines) were manually traced from digital images and X and Y coordinates were interpolated to 128 points. They transcribed video from a microscope and then performed Fourier Transforms on the resulting waveforms. They showed that cells that metastasize displayed more movement. A variety of vibrational data was hypothesized to correlate with such movement, but these data were not able to be recorded.

4) Vadalà, M., et al, "Mechanisms and Therapeutic Effectiveness of Pulsed Electromagnetic Field Therapy in Oncology," *Cancer Medicine*, vol. 5, no. 11, 2016, pp. 3128-3139. Vadalà, et al. explored the experimental and clinical evidence of using pulsed electromagnetic field (PEMF) therapy in oncology. The response of cells and tumor models to PEMF suggests that cells indeed may transmit chemomechanical information through harmonic wave motion, which could be better understood to inform cell biology and potentially to alter such signals in the treatment of cancers.

5) Guo, F., et al., "Three-Dimensional Manipulation of Single Cells Using Surface Acoustic Waves," *Proceedings of the National Academy of Sciences of the U.S.A.*, vol. 113, no. 6, 2016, pp. 1522-1527. Guo, et al. describe a technology to trap and manipulate small particles and cells in 3 dimensions using sound. The group previously showed the ability of these "acoustic tweezers" to separate 2 cell types in a non-invasive manner (Ding et al. Proc Natl Acad Sci USA. 2014 Sep. 9; 111(36):12992-7). While the authors claim the technique preserves the cell shape and physiologic characteristics, the idea that the harmonic information introduced to move micro particles or sort cells does not affect cellular biology has not been rigorously tested if indeed a tensegrity-matrix system is used to transmit and read chemomechanical energy through harmonic wave motion. The hypotheses proposed by Coffey and colleagues (reference 1) suggest that harmonic information generated, transmitted, and received may indeed both reflect and influence cellular behavior. Moreover, the technique applies vibrational energy to move cells, but does not disclose reading or scanning the vibrational signals and/or harmonics generated by cells themselves.

6) U.S. Pat. No. 3,761,187, "Flow-through chamber for photometers to measure and count particles in a dispersion medium," to Dittrich, et al., filed Dec. 23, 1971. "The present invention relates to automatic measuring and counting devices and, more particularly, to devices for selectively counting, measuring and classifying particles in a dispersion medium flowing across an optical path of light rays, with a substantial component of velocity parallel to the axis whereby various optical behavior of the particles is caused by different physical, physicalchemical or chemical properties of these particles." The '187 patent is the first to describe the use of fluorescent light applied to particles and cells, wherein the device measures various properties of light scatter and reflection off the particles as they pass through the light, with detectors positioned to capture such properties as the particles traverse the beam. The '187 patent discloses a fluorescence-based flow of cytometry system but no vibrational or harmonic information is captured.

7) Nelson, S. L., et al., "Vibrational Profiling of Brain Tumors and Cells," *Theranostics*, vol. 7, no. 9, 2017, pp. 2417-2430. Nelson, et al. demonstrated a method for converting vibrational signals to audible soundwaves by frequency modulation was demonstrated. The method combines non-contact atomic force microscopy (AFM) with a Spectrum Analyzer analysis to derive vibrational signals for various cell and tissue types. While the goal of obtaining biological vibrational signals is shared, this technique and the technology described herein are fundamentally different. The non-contact AFM approach by Sultan Nelson et al. is dependent on an ultra-sensitive cantilever positioned approximately 5 micrometers from the sample (a cell or a tissue), which reflects a laser signal onto a photodiode. Planar wave propagation generated from the sample induces movement of the cantilever, which causes deflection of the reflected laser signal from the cantilever to the photodiode. The measurements from such non-contact AFM may be affected by the distance from the cantilever to the sample and to the surface of the growth substrate. Additionally, the wave propagation generated by the sample would be integrated into vibrational signals which must be indirectly probed to identify the subcellular source by inhibiting or stimulating processes in the sample and inferring that changes in signals are due to these interventions. Thus, whenever a signal goes through a transition there can be signal accuracy loss. In the case of Saltan Nelson et al., the vibrational signals from the cells pass through a cantilever transition.

SUMMARY

Because cells and living tissue move, it has been theorized for decades that they produce vibrational spectra/frequencies by their movement. Time lapse video photography of this movement is common, but has limitations. In nature, such movements create a compression in the surrounding medium generating vibrational waves. Thus, it is desirable to measure the vibrational spectra of living tissue because that may provide new insights for the study and manipulation of cells and living tissue. It is also desirable to measure the cells' and living tissues' vibrational response to stimuli.

The machine, system and method disclosed herein are configured to discover, measure and characterize the vibrational spectra produced by living tissue. The machine, system and method disclosed herein are designed to measure the vibrational spectra produced by cells and has demonstrated clearly in this system, method and machine's early trials that the cells produce frequencies and show cell response with vibrational spectra movement to physiologically relevant stimuli (e.g., sex-steroid hormones, lipophilic factors, and glucose), drugs (e.g., TNF, taxanes, nocodazole, formaldehyde, etc.), electric stimulus, acids and bases, etc. The system and method for measuring these spectra in the computer software section of this disclosure can employ signal processing techniques disclosed in one or more of the following U.S. Patents, the contents of which are incorporated herein by reference: Fast Find Fundamental Method U.S. Pat. No. 6,766,288; Precision Measurement of Waveforms U.S. Pat. No. 8,620,976; Precision Measurement of Waveforms U.S. Pat. No. 9,600,445; A Precision Measurement of Waveforms Using Deconvolution and Windowing U.S. Pat. No. 9,390,066; Domain Identification and Separation for Precision Measurement of Waveforms U.S. Pat. No. 9,279,839.

Fourier and wavelet transforms may also be utilized, though these transforms tend to smear time, amplitude and/or frequency and/or low level peaks and vibrational spectra. Simple thresholding is commonly used to separate signals from noise.

In an embodiment, the disclosed system measures the vibrational signals generated from the direct application of light onto the sample itself. This allows for the novel determination of direct vibrational signals generated not only by the sample as a single entity, but by subcellular structures (e.g., mitochondria, individual proteins, and nuclei). This can be done using fluorescent labeling of the structures with chemical dyes or overexpression of fluorescent-labeled molecules of selected excitation and emission properties, and detecting these specific emission signals by restricting the signals measured at the level of the detected wavelengths.

This includes measuring sub-sonic, sonic and ultrasonic frequency ranges of movements, vibrations, cellular motion, harmonics and/or frequencies of cells over a fixed and/or continuous time period to capture the cells dynamic vibrational spectra change over time. Analyzation of which sub-cellular entity produces which vibrational spectra is thus made possible as disclosed below.

Further features and advantages of the invention, as well as the structure and operation of various implementations of the invention, are described in detail below with reference to the accompanying drawings. It is noted that the invention is not limited to the specific implementations described herein. Such implementations are presented herein for illustrative purposes only. Additional modifications may be apparent to persons skilled in the relevant art(s) based on the teachings contained herein.

BRIEF DESCRIPTION OF THE DRAWINGS

The accompanying drawings/figures, which are incorporated herein and form part of the specification, illustrate the present invention(s) and, together with the description, further serve to explain the principles of the present invention(s) and to enable a person skilled in the relevant art(s) to make and use the present invention(s).

Figure 1:
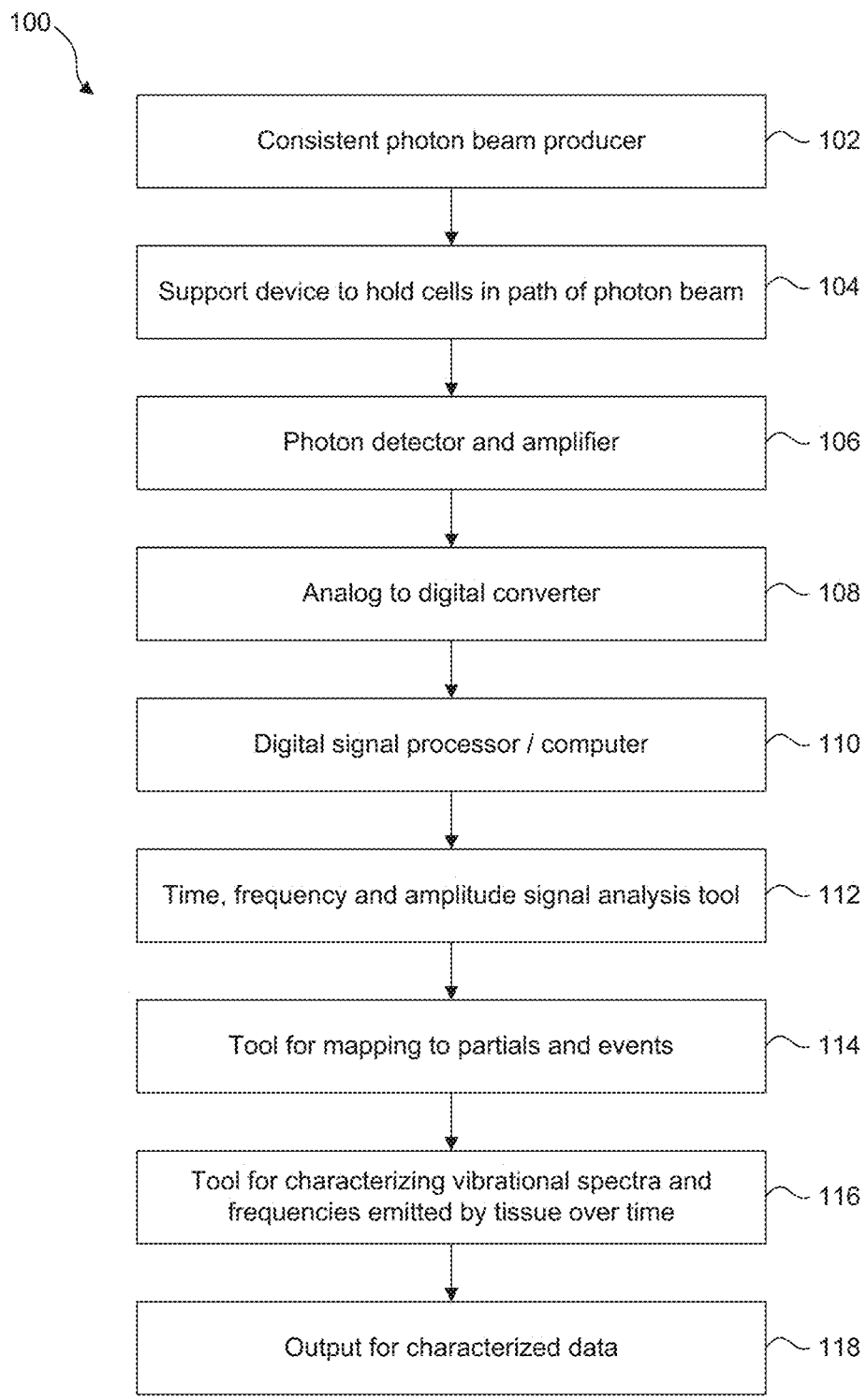
FIG. 1 is a block diagram illustrating the measurement of vibrational spectra of cells/tissue, in accordance with the present disclosure.

The features and advantages of the present invention will become more apparent from the detailed description set forth below when taken in conjunction with the drawings. Unless otherwise indicated, the drawings provided throughout the disclosure should not be interpreted as to-scale drawings. Additionally, the text included in the illustrated block diagrams is provided as an example and is not intended to specifically limit any given step or element of the invention(s) described herein.

DETAILED DESCRIPTION OF THE INVENTION

Although specific configurations and arrangements may be discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications beyond those specifically mentioned herein. It should be appreciated that the particular implementations shown and described herein are examples and are not intended to otherwise limit the scope of the application in any way.

All numbers in this description indicating amounts, ratios of materials, physical properties of materials, and/or use are to be understood as modified by the word "about," except as otherwise explicitly indicated.

The term "about" as used herein indicates the value of a given quantity varies by up to about ±25% of the value. For example, "about 100 nm" encompasses a range of sizes from about 75 nm to about 125 nm, inclusive.

The following definitions are used herein.

A-to-D (A/D) Converter: Analog to digital converter.

Bandpass Filter: A device used to permit light of a specified, narrow range of wavelengths to pass through to a detector.

CCD: A charged coupled device as in types of detectors in cameras and/or video cameras.

Cell(s): The smallest structural and functional unit of living tissues.

Cellular Motion: Cellular movement is motion concerned with all types of movement at the cellular level. It covers cellular locomotion, as well as molecular mechanisms that achieve movement.

Chain(s): Linked collections of partials.

Characterizing: Describe the distinctive nature or features of a phenomenon.

Consistent Photon Source: A producer of a low noise photon beam.

Continuous Wavelet Transform: In mathematics, the continuous wavelet transform (CWT) is a formal (i.e., non-numerical) tool that provides an over complete representation of a signal by letting the translation and scale parameter of the wavelets vary continuously.

Dichroic Mirror: A device used to direct light of specified wavelengths to a detector. A long pass dichroic will direct light of wavelengths greater than an indicated wavelength.

Domain: A collection of events organized by certain properties.

Event: An event is a collection of partials, localizing in time and frequency, having similarities in certain topological properties.

Fluorescent markers: Tags or dyes that emit photons at a specific frequency when energized by an energy source such as a laser at a higher frequency. Fluorescence is a phenomenon characterized by a molecular absorption of excitation photons of a particular wavelength, resulting in the emission of photons with characteristic, longer wavelengths. Numerous small-molecules ("dyes"), macro-molecules ("tags"), as well as quantum dots (e.g., inorganic nanocrystals) bearing fluorescent properties can be added to cells and tissues with specificity for reactions, conditions, sub-cellular structures, and other biological features. Such molecules include, but are not limited here to, molecules with specificity for sub-cellular structures and fluorescent proteins which are engineered to be produced by cells and tissues.

Fourier Transform: An algorithm that computes the amplitudes of the spectrum for a waveform.

Frequencies: The plural of the rate at which something occurs or is repeated over a particular period of time or in a given sample, the rate at which a vibration occurs.

Frequency bin: A small range of frequencies (e.g., 1702-1704 Hz).

Harmonics: Any entity oscillating, vibrating or rotating creates harmonics that are approximately integer multiples of the fundamental frequency of the moving entity. Harmonics are typically assigned a ranking number, such as the $7^{th}$ harmonic of 100 Hz is approximately 700 Hz. These harmonics are typically thought of as sinusoidal entities created by the moving object.

Histogram: A diagram consisting of rectangles whose area is proportional to the frequency of a variable and whose width is equal to the class interval.

Living Tissue: Any plurality of cells in a living organism that can have a particular function.

Measuring: Ascertain the size, amplitude, amount, or degree of movement, vibration and/or intensity by using an instrument or device mechanically and electronically gauged according to standard units or by comparing it to a reference.

Modulation: The exertion of a modifying or controlling influence on something; variation in the amplitude, frequency, strength, tone, or pitch over time. For this application, modulation shall mean cellular motion of the living tissue that varies an amount of the photon beam that is blocked, absorbed or deflected, thereby directly modulating a remaining portion of the photon beam to be detected.

Movie and/or video: For the purposes of this document only, a stream of images with a frame rate, such as 30 frames per second, which can then be viewed as a changing image or waveform over time.

Partial: A localized region bounded by well specified, narrow ranges of time, frequency and amplitude, which can have additional well-specified topological properties.

Photon Detector: A device or instrument designed to detect the presence of light and emit a voltage signal (electron stream) in response.

PMM: "Precision Measuring Matrix" as disclosed in U.S. Pat. No. 8,620,976.

Signal: An electrical impulse transmitted or received.

Signal Processing: An electrical engineering subfield that focuses on analyzing, modifying and synthesizing signals such as sound, images and biological measurements. Signal processing techniques can be used to improve transmission, storage efficiency and subjective quality and to also emphasize or detect components of interest in a measured signal. Most uses are now handled in a digital domain and include a computer or equivalent chip.

Streamed: Steady analog or digital flow of electrons—not at a frame rate like video.

Sub-cellular: Structures comprising various components of cells and biological matter which can be characterized as organelles (e.g., mitochondria, nuclei) or structures found within and associated with cells (e.g., proteins).

Topological properties (for linking partials and events): The relation of a given partial's amplitude value in comparison to its neighboring partials. Such a property can be e.g., a local maximum, a saddle point or other similar topological feature.

Vibrational Spectra: The characterization in terms of its frequency content is called the spectrum of the signal. A vibrational spectrum, including sub-sonic/sonic/ultrasonic is a representation of a sound in terms of its frequency content. Often this can be represented as a set of discrete frequencies that may vary with time and additional broad spectrum noise. It is usually presented as a graph or a spectral display/spectrogram.

Waveform: A signal as a function of time.

Any conflict between any reference cited herein and the specific teachings of this specification shall be resolved in favor of the latter. Likewise, any conflict between an art understood definition of a word or phrase and a definition of the word or phrase as specifically taught in this specification shall be resolved in favor of the latter.

Technical and scientific terms used herein have the meaning commonly understood by one of skill in the art to which the present application pertains, unless otherwise defined. Reference is made herein to various methodologies and materials known to those of skill in the art.

Overview

Disclosed is a system and method to measure and characterize the vibrational spectra produced by living tissue. The vibrational spectra produced by the cells/living tissue are of extraordinarily low amplitude. The subject of this invention is a machine, system and method that is extremely sensitive and is configured to detect and measure frequencies at or below the noise level produced by the laser, the detector and the surrounding environment.

The machine is mounted on a sound absorber effective to very low frequencies. The machine uses a very low noise light source (such as a low-noise and/or limited bandwidth laser) with controlled light beam level amplitude and beam diameter, to shine a beam of photons by and through living cells. The beam strength can either be constant, interrupted, or otherwise modulated to facilitate the analysis. This enables various other analysis modes, such as employing a phase-locked loop configuration or operate in a frequency mixer mode, shifting the detected oscillations of the cell to a different frequency band by chopping the frequency of the laser.

As the cells move, they are exposed to and thus modulate the incident photon beam and vary how much of the beam is blocked, absorbed or deflected. This modulated photon beam is then detected, quantified and analyzed, revealing details about how the cells move, vibrate and/or undulate. The beam can be first split into two beams and processed via two bean branches, one for measuring the cell and the other as a reference for noise cancellation, with the reference beam going directly to a photon detector. After being modulated by the cell, the photon beam it may be split again into several beams, one for the eye piece, one for the low light camera (for alignment purposes), and one for the photon multiplier tube that is a streamed output photon detector. Each photon detector produces a signal voltage output—V(t)—as a function of time.

The system can be used to measure not only the overall or integrated movement of cells and tissues, but also sub-cellular structures and conditions that may have characteristic and meaningful movement. Here, a fluorescent marker (e.g., molecules, also referred to as tags, and which may comprise dyes) can be exploited to emit light at longer wavelengths than the excitation wavelength (here about 500 nm). Light emitted from the sub-cellular structure(s) is passed through long pass dichroic mirrors (specifically directing light of wavelengths greater than a set value) to pass on to bandpass filters. These filters allow only emitted light of specified wavelength to reach the detector, providing detection of light specifically from the sub-cellular structure(s) explained below with regard to FIG. 10. The resulting signal will provide the vibrational spectra of sub-cellular structures of interest while blocking the excitation light.

The output of the two photon detectors is then compared, with bias assistance, to yield a noise canceled signal S(t). If the beam is not split, the output of the photon detector is simply S(t). The resulting signal is passed into an analog to digital converter, and the resulting digital signal fed into a computer or data storage device (e.g., non-volatile storage). The Precision Measuring Matrix can be used to develop partials and events, and subsequently associated histograms, that yield results as aggregations of frequency events over time and potential harmonics. This can be done in real-time or from accessing recorded data. The system and method thus provides a digitized representation of the vibrational spectra of the cells/living tissue. Note that the longer the detection period is in time (recording the signal) the better the signal to noise ratio can be. These signals can be stopped through chemical fixation of the cells/tissue by a compound like formaldehyde (which halts cellular vibrational spectra/movement).

The design of the hardware in this invention was driven by a number of factors:

The cells are live, and must be studied in vivo, so even extended observations must not cause any real harm to the cells.

This places strong constraints on the intensity of the incident light/photon beam, significantly decreasing the signal-to-noise of the measurements.

The vibrations of the cells can be measured up to frequencies in the few hundred kHz range, thus we must be able to read the detectors at such rates.

The signal-to-noise of the measured signal should be close to the theoretical maximum, i.e. the shot noise due to the number of discrete photo-electrons detected from the incident light/photon beam. Additional sources of noise must also be reduced or eliminated.

These constraints essentially rule out the practical use of many-pixel imaging devices, like high speed video cameras or many-pixel CCDs. The readout speed of these CCDs is limited, and may contribute additional noise to each pixel (on top of the unavoidable photon shot noise), like readout noise, effects of charge transfer inside the detector. Providing an imaging resolution is of limited utility for the purpose of characterizing the vibrations of the cells. This led us to the use of a "single pixel" photon-detector, based on a high-sensitivity photomultiplier streamed electron output that operates at broad frequency ranges.

Description of Exemplary Systems and Methods

FIG. 1 illustrates an example system 100 for measuring vibrational spectra of cells or living tissue. System 100 includes a low noise consistent photon beam producer 102 (such as a medical laser) that delivers light through a support device 104 holding the cells and/or living tissue. System 100 also includes a photon detector and amplifier 106 for detecting/amplifying the modulated light from passing through and/or by the cells/living tissue. The streamed signal from the photon detector/amplifier 106 is passed from an A/D converter 108 and then on to a digital signal processor 110. The digital signal processor can be designed to have various software modules for analyzing the data. A first analysis module 112 can be used to characterize time, frequency, and amplitude of the signal. Another analysis module 114 can be used to map the received signals to partials and events.

Another module 116 can be used to characterize the vibrational spectra and frequencies emitted by the cells/tissue over a given period of time. Ultimately, system 100 provides output data 118 that can be stored in a memory and/or provided to a display. The output data 118 can include the vibrational spectra of the cells/tissue for a given time period, or an analysis of the vibrational spectra as it changes over time. The data can be stored in digital file format, transmitted electronically, or hard copy outputted.

Figure 2:
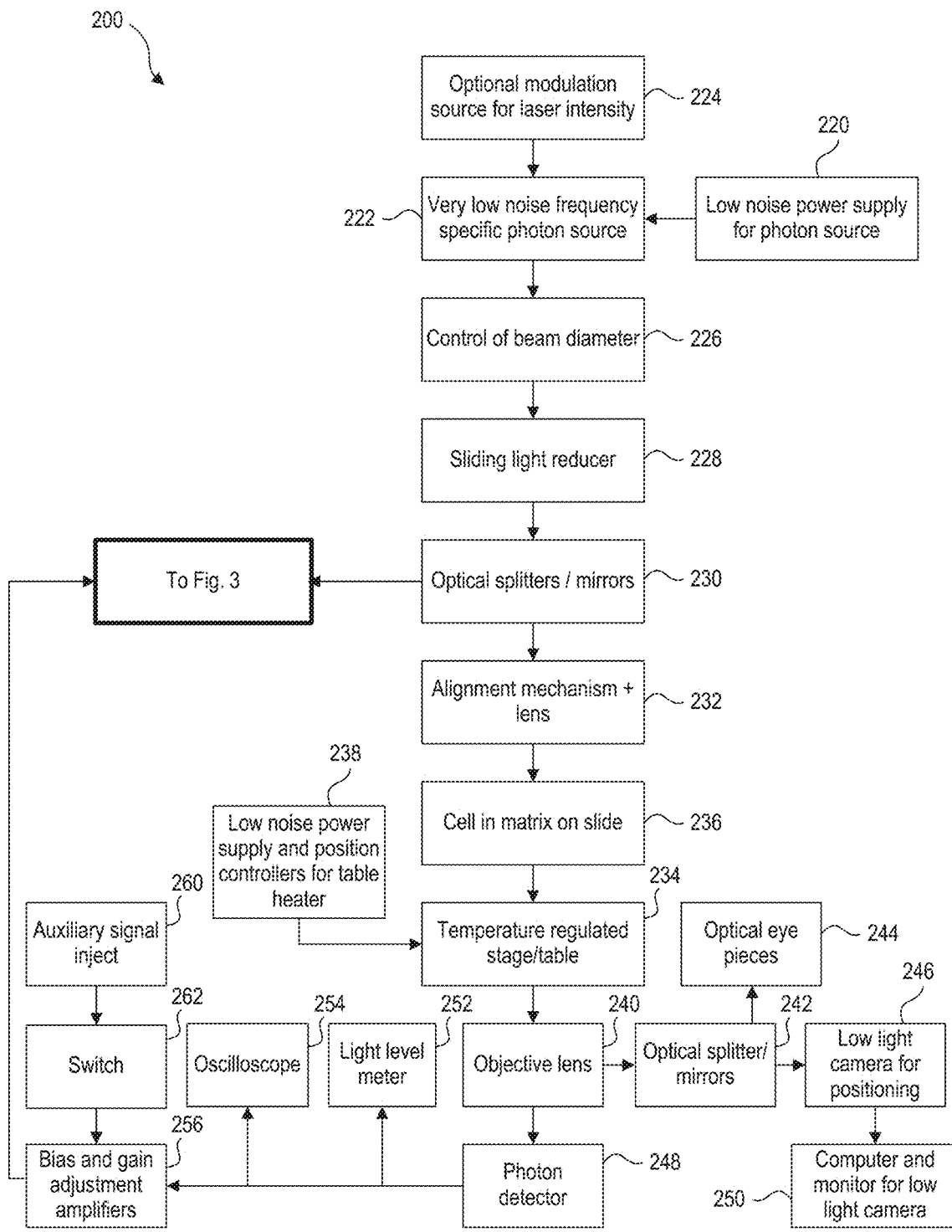
FIG. 2 is a more detailed block diagram illustrating a system for measuring vibrational spectra of cells/tissue, in accordance with the present disclosure.

FIG. 2 illustrates another system 200 for measuring vibrational spectra of cells or living tissue, according to the invention(s). A low noise power supply 220 for the photon beam is utilized. This can be either a DC battery or a low noise DC power supply. This power supply 220 feeds a consistent low noise frequency photon source 222 to produce a photon beam (not depicted). In an exemplary embodiment, this low noise laser has a wavelength of around 500 nm. An optional modulation source 224 can be used to modulate the laser intensity and can reduce the noise of the outputted photon beam. Additionally, lasers generating light of higher or lower wavelengths can be interchanged or added when specific wavelengths may be indicated.

A module for controlling the beam diameter 226 can be provided in the photon beam path. The photon beam is then passed through a sliding light reducer 228, which can include a single lens having a varying amount of light blocking ability to control the amplitude of the photon beam. The beam is passed through an optical splitter 230, which can include one or more mirrors for dividing the beam into two beams. One beam is directed towards the cells and the other beam towards a separate detector for noise reduction (e.g., in FIG. 3).

The beam is then directed towards an alignment mechanism 232 for aligning the beam so that as the beam passes through the optics it is centered in the middle of the detector after the cells and the lens. Alignment mechanism 232 can include a rotating lens. In addition, an alignment mechanism and a lens can be used for noise reduction of the beam after the splitter (see arrow to FIG. 3).

A table 234 having an optional regulated temperature controlled heater can be used to support and/or hold the cells/tissue 236. Cells/tissue 236 themselves can be provided in a matrix and placed on the table so the beam can pass by or through them. An optional low noise power supply and stepping motor 238 can be utilized for moving the cells into different positions within the beam.

The beam then enters an objective lens 240, and can be split into up to three beams with optical beam splitters 242, for example. The three beams can then enter optical eye pieces 244, a low light camera 246 used for positioning, and a photon detector 248. Low light camera 246 can also be connected to a computer 250 to provide the output of camera 246 to a display.

Photon detector 248 can comprise a low noise photon multiplying tube (or an appropriate low noise CCD). A light level meter 252 can be connected to the photon detector 248 output to prevent overload of the detector or underload for not enough detector signal. The streamed output of photon detector 248 can also go to an oscilloscope 254 for monitoring the signal and the noise level. The output of photon detector 248 can also enter bias and gain adjustment and amplifiers 256, which can assist with DC offset and signal level. Photon detector output from bias and gain adjustment amplifiers 256 is connected to the comparison amplifiers (e.g., in FIG. 3).

An optional auxiliary signal injection element 260 can be used to assist with noise as necessary that enters bias and gain adjustment and amplifiers 256. A switch 262 can be used to turn signal injection element 260 on and off.

Figure 3:
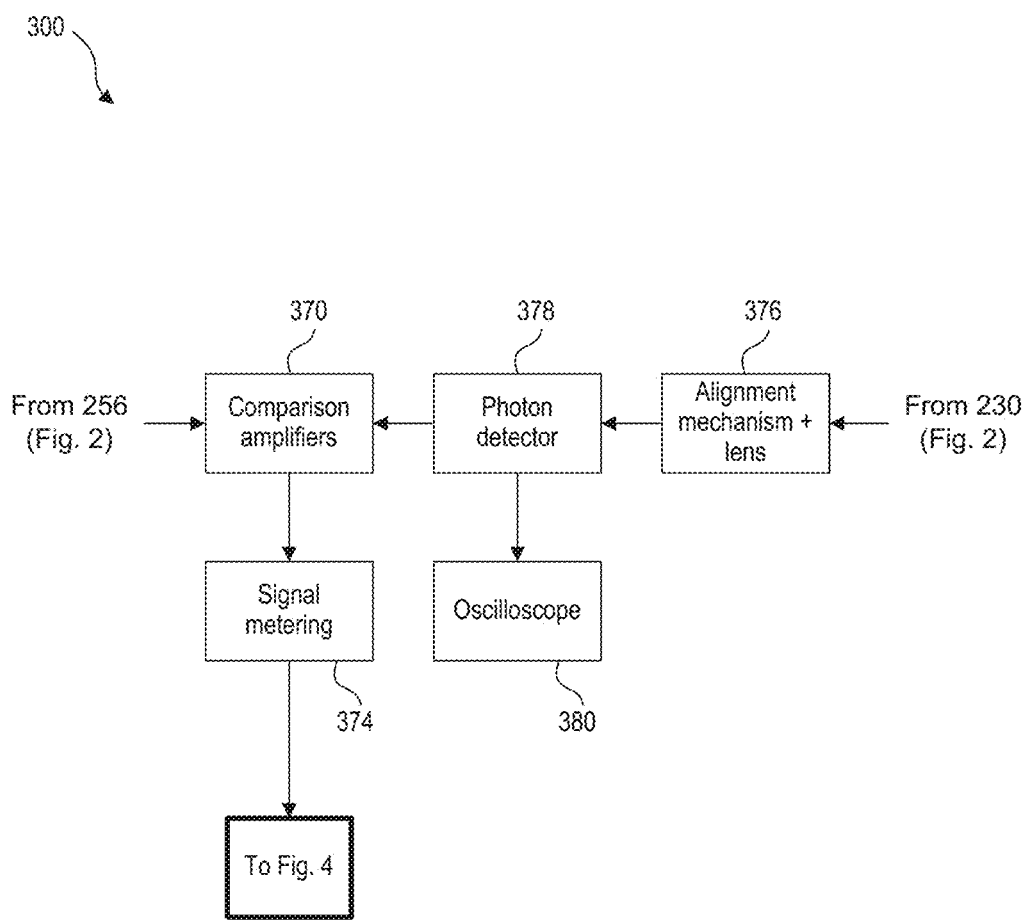
FIG. 3 illustrates a measuring method, in accordance with the present disclosure.

A detection system 300 is used to receive the reference photon beam from optical splitter 230 and is illustrated in more detail in FIG. 3. A measuring system 400 and characterization system 402 receive the output from detection system 300 and are illustrated in more detail in FIG. 4.

FIG. 3 illustrates a detection system 300 used for detecting the reference photon beam to reduce (or cancel) noise in the optical source. Photon detector output 256, illustrated in FIG. 2, enters a modulated signal input of comparison/amplifiers 370 and is passed to a measuring system 400 (described further below) via signal metering 374. The reference photon beam is received from optical splitter 230 illustrated in FIG. 2, and similarly traverses an alignment mechanism 376 and second photon detector 378. The output of the second photon detector 378 is also input to the comparison/amplifiers 370 (e.g., such as a differential amplifier) for comparison to the photon detector output 256. The reference photon beam may also be shown on an oscilloscope 380.

Figure 4:
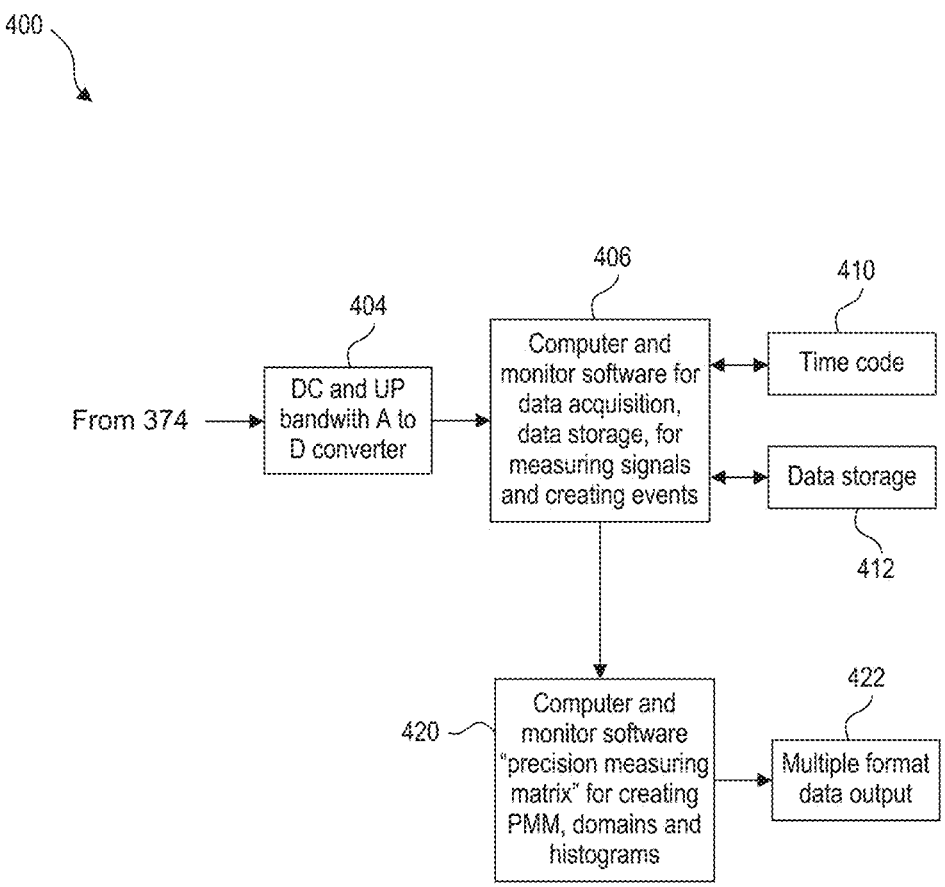
FIG. 4 illustrates a measuring and characterization method, in accordance with the present disclosure.

FIG. 4 illustrates a measuring and characterization system 400. The signal modulated by the cell/tissue movement enters an A/D converter 404. The resulting digital signal is then received by a controller 406 that is designed to acquire the data, store the data, and perform digital measuring of the signals to create partial and event information. An optional time code module 410 is included for tracking an optional video, the stimuli and the characterized results simultaneously. Measuring system 400 can also include a memory 412 (non-volatile data storage, such as an HDD or solid state digital storage unit) for storing the signals and the characterization results long term. The generated partial and event data can then be received by a characterization system 420, which can include a Precision Measuring Matrix (PMM) (or other time/frequency/amplitude software) for creating 3D matrix outputs and/or histograms, and/or characterization data based on filtering of the events created from the digital signal stream. These measured moving cells create at times harmonics that are measured by the PMM utilizing the harmonic domain. The PMM can be implemented in hardware, software, or a combination of both. PMM can be a software module that is executed by controller 406. The data can then be provided in multiple data formats 422 to be received by other devices.

Figure 5:
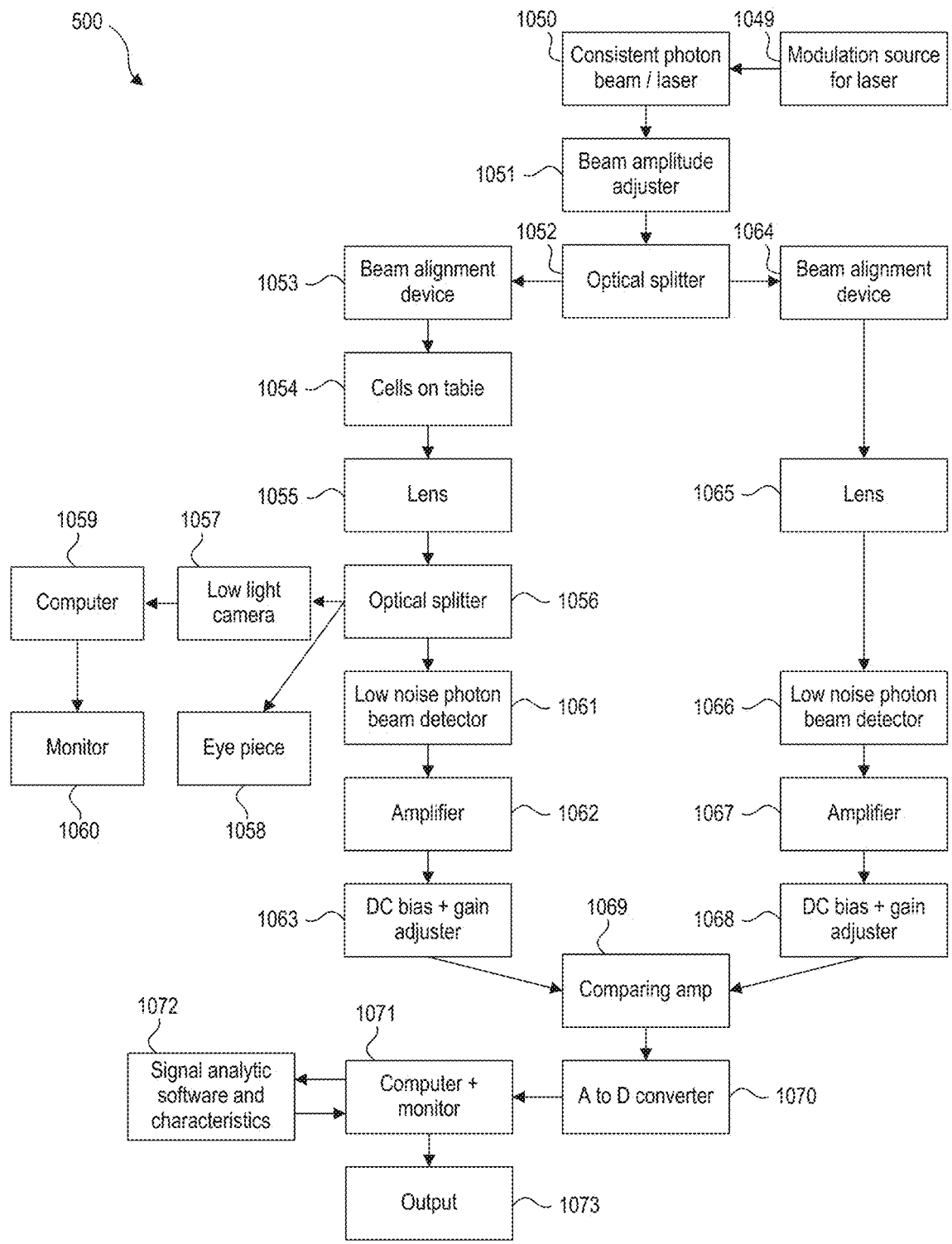
FIG. 5 is another block diagram illustrating a system for measuring vibrational spectra of cells/tissue, in accordance with the present disclosure.

FIG. 5 illustrates another system 500 for measuring vibrational spectra of cells or living tissue. System 500 combines many of the features discussed above in systems 200, 300, 400, and the specific details of each element are thus not repeated.

Figure 6:
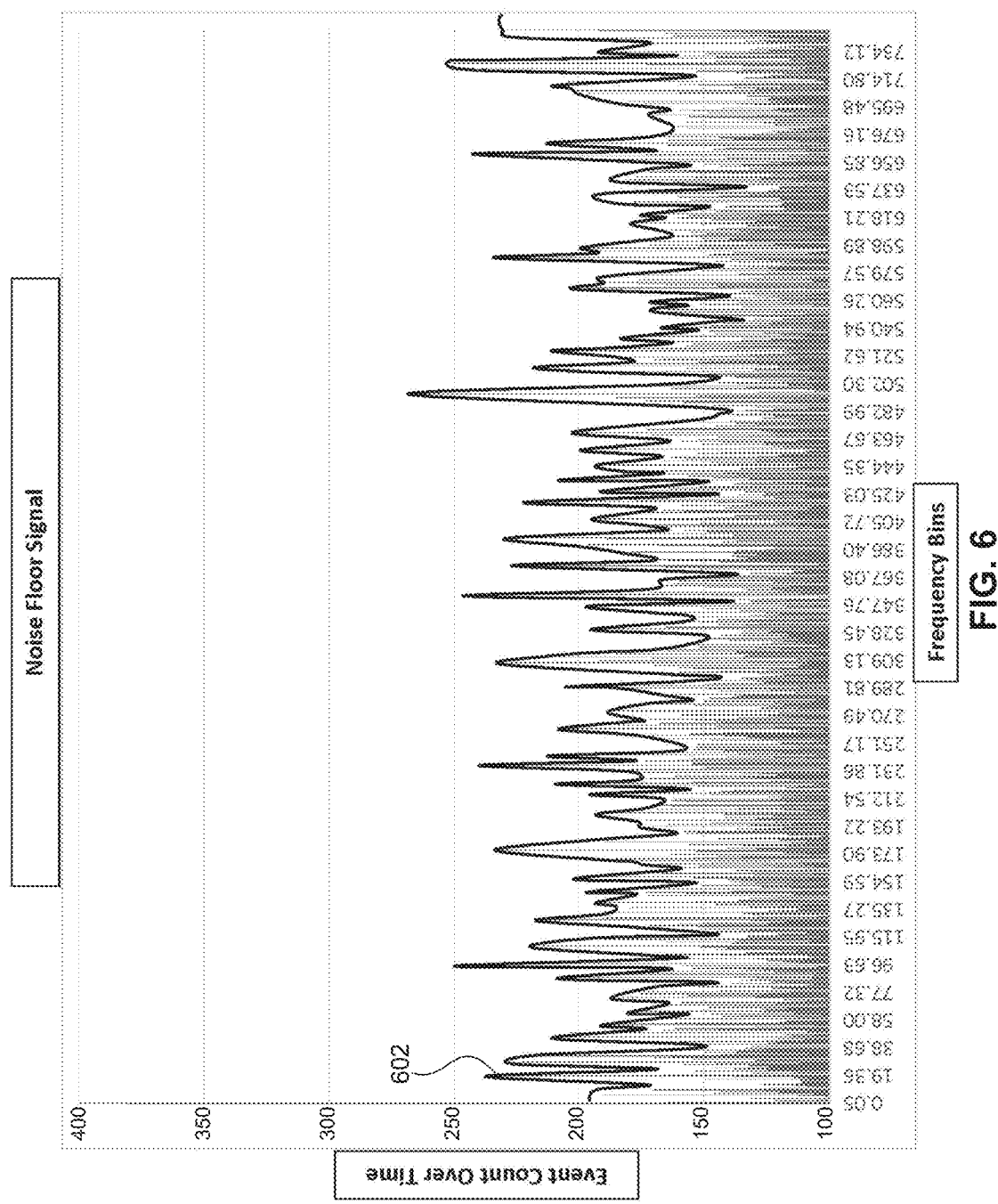
FIG. 6 is a graph of the noise floor of cancer cells that are dead from formaldehyde, with the X axis as frequency bin numbers, not specific frequencies. Y axis is a count of each frequency bin activity over time, in accordance with the present disclosure.
Figure 7:
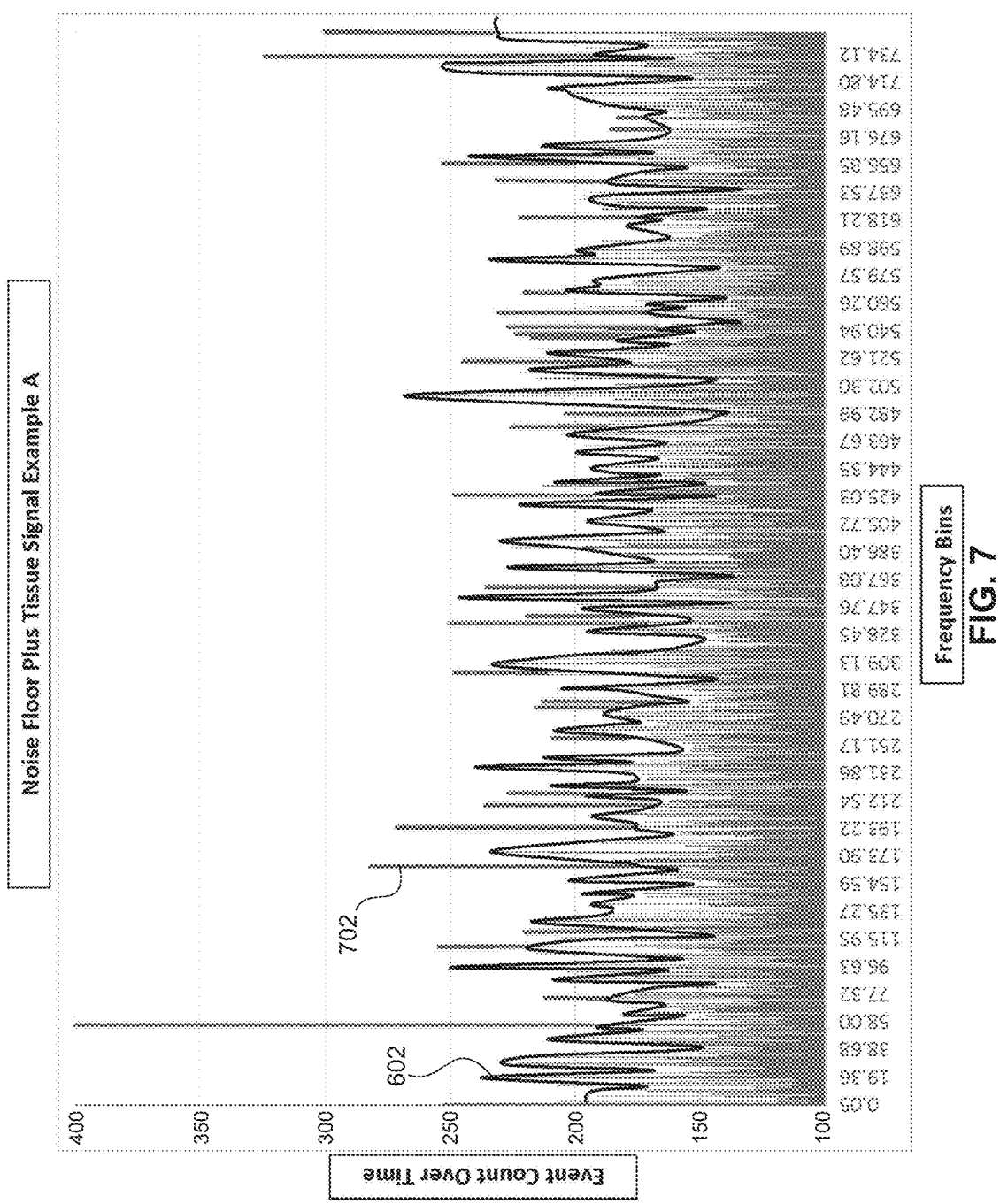
FIG. 7 is a graph of the noise floor plus cancer cell tissue signal (example A—60 seconds, the blue lines are a count of event frequencies, the black line is the noise floor graph and the red lines are the frequency event counts above the noise floor of the cancer cells/tissue, with the X axis as frequency bin numbers, not specific frequencies). Y axis is a count of each frequency bin activity over time, in accordance with the present disclosure.
Figure 8:
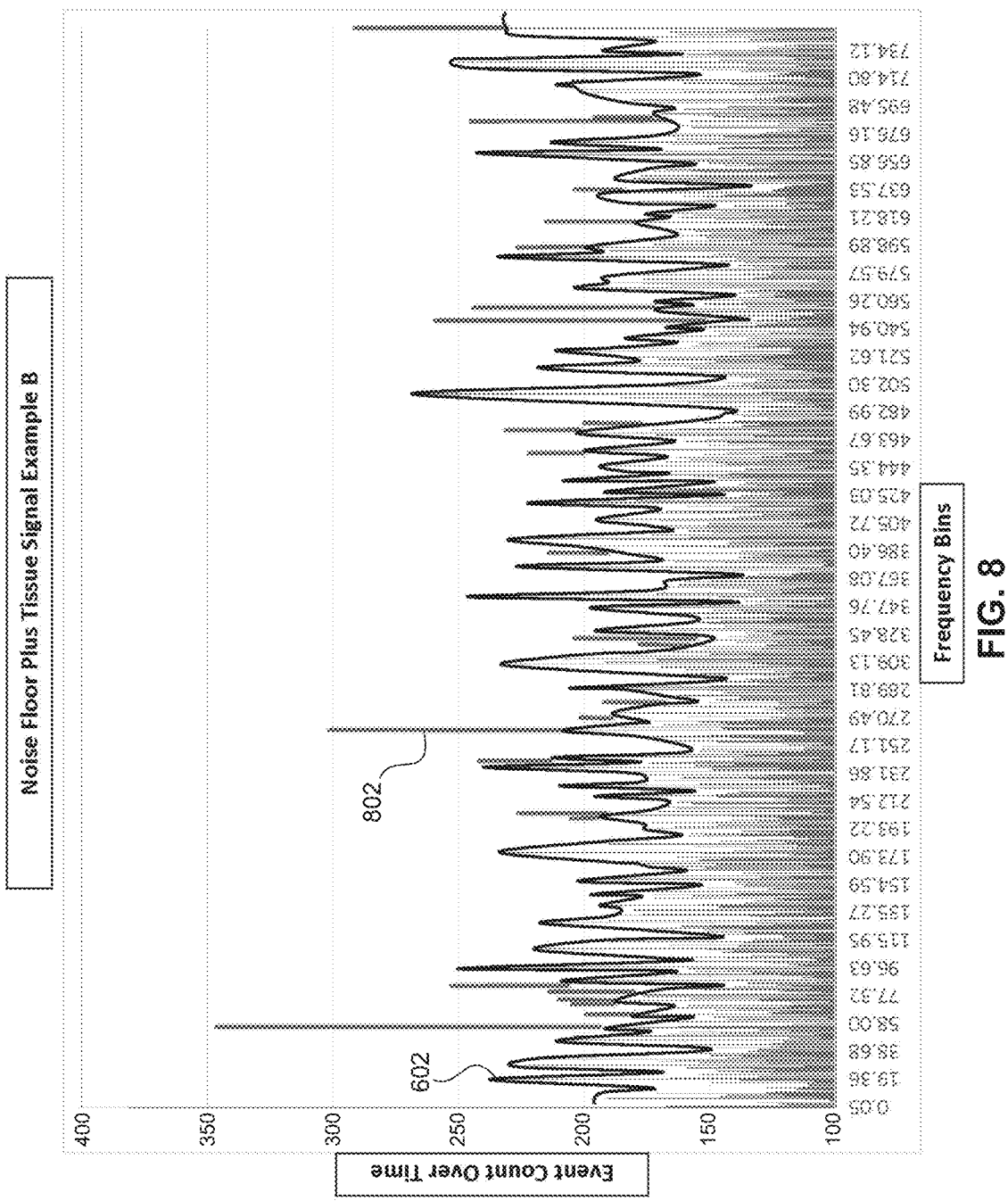
FIG. 8 is a graph of the noise floor plus cancer cell tissue signal (example B—60 seconds, the blue lines are a count of event frequencies, the black line is the noise floor graph and the red lines are the frequency event counts above the noise floor of the cancer cells/tissue. These results were taken 15 minutes after FIG. 7 with the same cells, with the X axis as frequency bin numbers, not specific frequencies). Y axis is a count of each frequency bin activity over time, in accordance with the present disclosure.

FIGS. 6-8 illustrate example spectra of the counts of different frequency bins over a given period time. FIG. 6 illustrates a noise floor spectra 602 corresponding to background noise of the system over a period of 60 seconds. Noise floor spectra 602 can be collected by using dead cells on the stage (such that the cells do not move at all).

FIG. 7 illustrates a spectra that includes noise floor spectra 602 and additional frequency content (spikes) 702 collected as a result of cell/tissue movement for a first cell sample over a period of 60 seconds. The cells used in this particular example were cancer cells, though any cell types could be used.

FIG. 8 illustrates a spectra that includes noise floor spectra 602 and additional frequency content (spikes) 802 collected as a result of cell/tissue movement for the same first cell sample over a period of 60 seconds. The spectra in FIG. 8 was collected 15 minutes after the spectra illustrated in FIG. 7. The change in the frequency counts for a given short time window (e.g., 60 seconds) when viewed over a longer period of time provide useful information regarding the cell/tissue movement and the responses of the cells/tissue to external stimuli.

Figure 9:
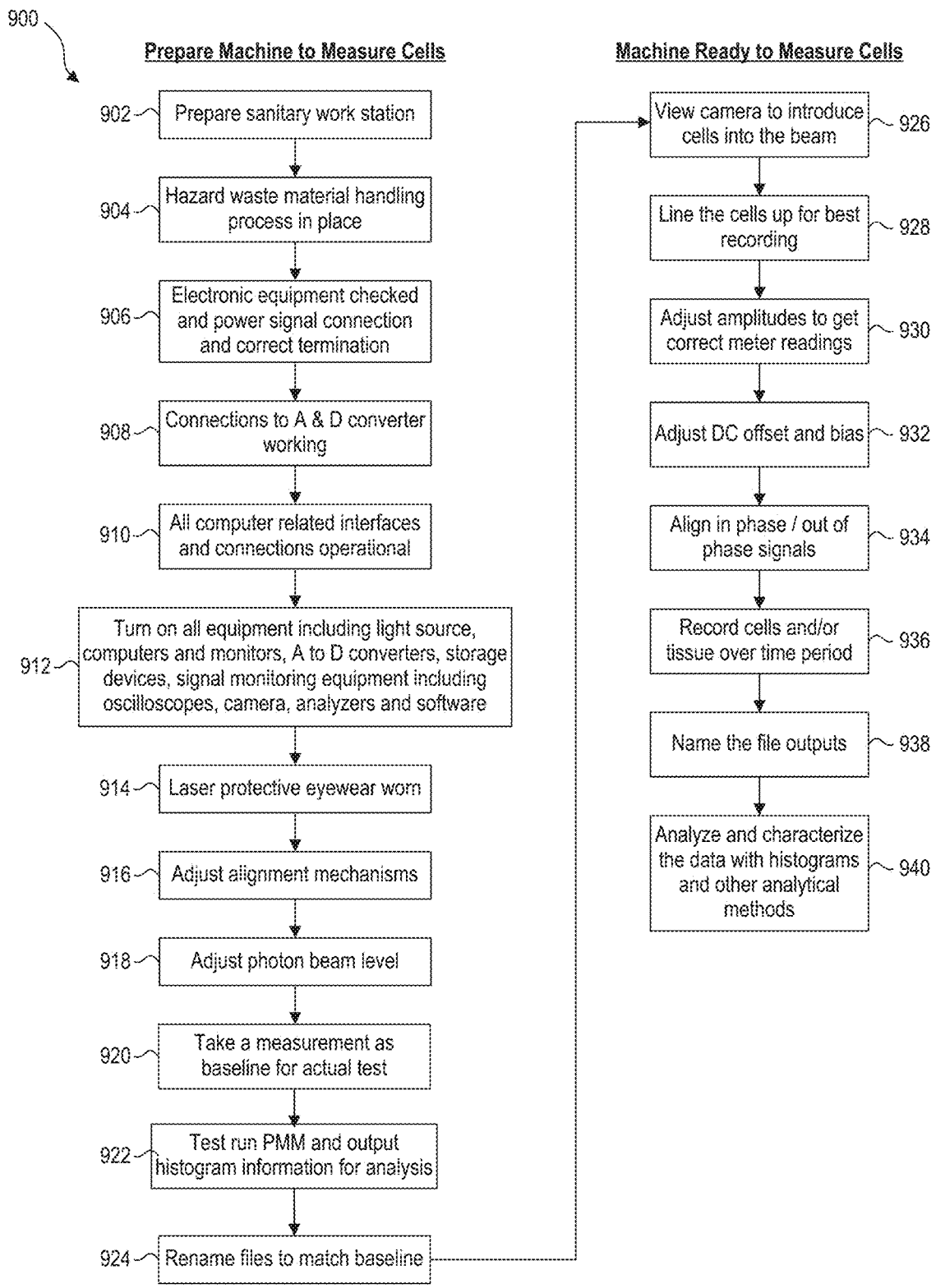
FIG. 9 is a block diagram illustrating a sequence method for measuring vibrational spectra of cells/tissue, in accordance with the present disclosure.

FIG. 9 illustrates an example method 900 for measuring vibrational spectra of cells and/or living tissue. It should be understood that the operations shown in method 900 are not exhaustive and that other operations can be performed as well before, after, or between any of the illustrated operations. The operations of method 900 can be performed in a different order and/or vary.

A sanitary workstation can be prepared at step 902, which can involve removing any hazardous waste at step 904 in the workstation area. At step 906, the electronic equipment is checked for correct connections and the connections to the A/D converters are checked at step 908. At step 910, all computer related equipment and interfaces are checked for correct operation. At step 912, all equipment can be powered on, which may include the light source, computers and monitors, A/D converters, storage devices, and signal monitoring equipment, such as oscilloscopes, cameras, analyzer, and/or software.

At step 914, protective eyewear is worn by any users. At step 916, alignment mechanisms are adjusted, and at step 918, the photon beam level is adjusted. At step 920, a baseline measurement is taken using either a blank cell container, or a cell container having dead cells on it (e.g., the cells do not move or react to any external stimuli). At step 922, a PMM (or another appropriate analytical algorithm) is performed on the baseline measurement and a histogram can be generated for analysis. At step 924, files can be saved having a name to match the baseline operation. At this point, the system is ready to begin measuring real cell/tissue samples, as illustrated at step 926.

At step 928, the cell/tissue sample to be measured is lined up under the photon beam for the best recording result. At step 930, amplitudes of the various photon beams are adjusted to obtain optimal meter readings. At step 932, the DC offset and bias can be adjusted to align the measured (cell modulated) and reference signals (step 934). In some examples, a motorized table can be used to align the cells/tissue sample at an optimal location under the photon beam. A table heater can also be used to provide a temperature to support cell life.

At step 936, the light received from the cells/tissue sample is recorded over a given time period. The recordation period may be a relatively short time window such as, for example, 30 seconds, 60 seconds, 90 seconds, or 120 seconds. Multiple recordings having a length of the given time period can be captured over a longer time period such as, for example, 30 minutes, 60 minutes, 90 minutes, or 120 minutes. Each recording can be saved as a separate file, or saved together as a single file over the longer time period.

At step 938, the saved files are named, and at step 940, the saved spectra can be analyzed and characterized using any known analytical methods.

Figure 10:
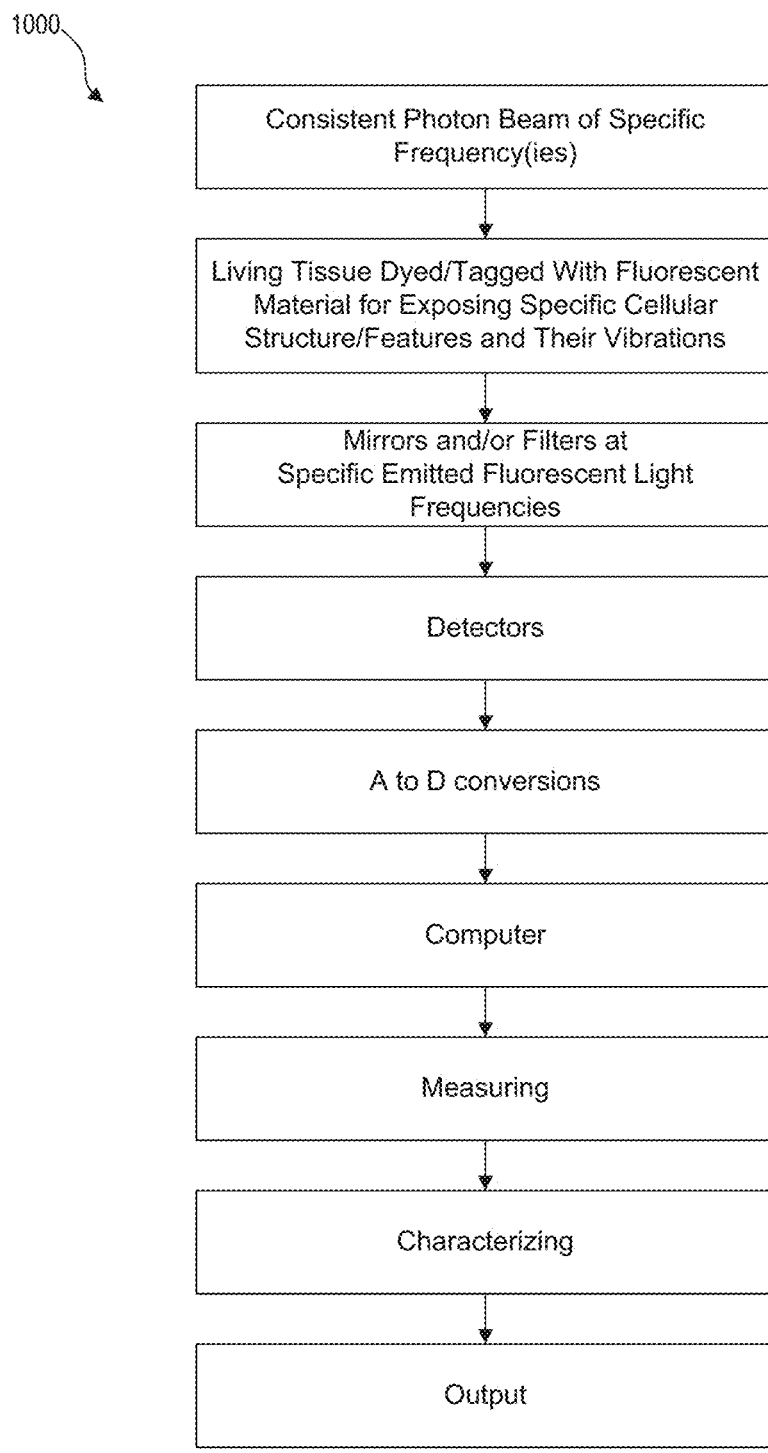
FIG. 10 is a block diagram illustrating a sequence method for measuring vibrational spectra of specific sub-cellular structures based on tissues or cells bearing a fluorescent marker (e.g., tag or dye) in which only emitted modulated light from these structures is measured for vibrational spectra, in accordance with the present disclosure.

FIG. 10 illustrates an example method for measuring vibrational spectra of sub-cellular structures within cells and/or living tissues. Single- or multiple wavelength-generating lasers may be employed to excite fluorescently labeled molecules specific to a sub-cellular structure. The resulting emission wavelength will be longer than that of the excitation wavelength, and will be specifically directed by one or more dichroic mirrors to one more bandpass filters. These bandpass filters will allow a narrow range of desired wavelength light to pass to a detector positioned downstream for recording and subsequent analysis. The resulting signals therefore represent vibrational spectra of specific sub-cellular structures and features of living cells or tissues. These signals can be used alone or simultaneously with multiple excitation lasers, multiple detectors, dichroics, and bandpass filters as well as video detection to obtain single-cell vibrational spectra of desired sub-cellular structures and features.

Figure 11:
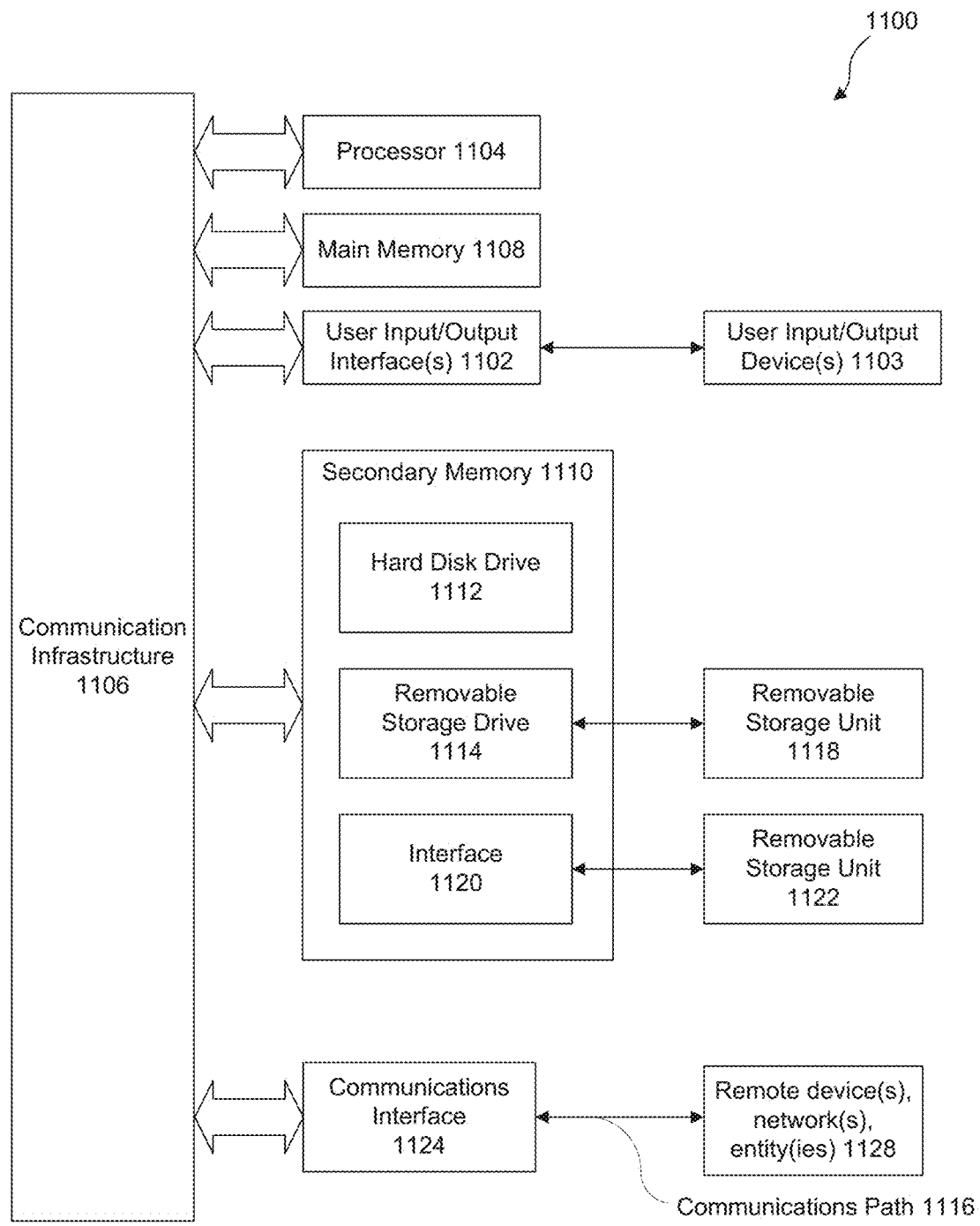
FIG. 11 is an illustration of an example computer system, in accordance with the present disclosure.
Figure 12A:
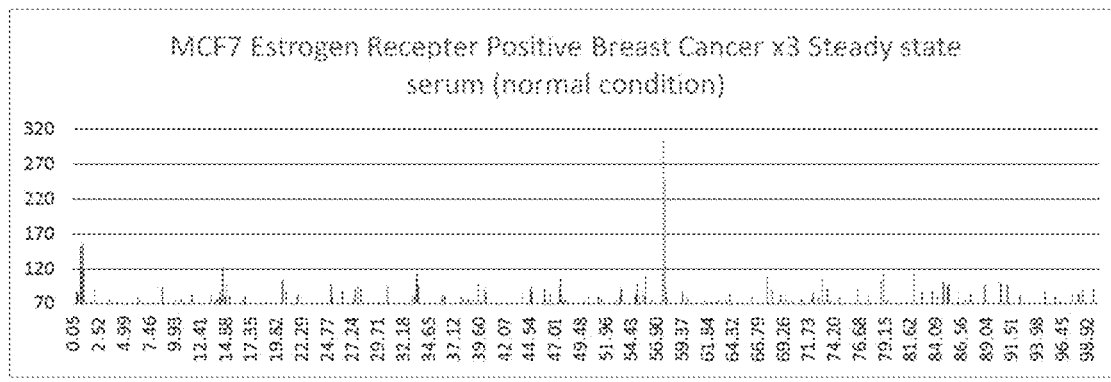
FIG. 12A-C shows the transition between MCF7 estrogen receptor-positive breast cancer cells in a 10% serum steady state (FIG. 12A), then after 30 mins of 10% serum following overnight serum-deprivation (FIG. 12B), then a kill state with formaldehyde-fixation fed after 15 mins (FIG. 12C). X axis is frequency bins 0 Hz to 100 Hz. Y axis is the total event count for each frequency over time, in accordance with the present disclosure.
Figure 12B:
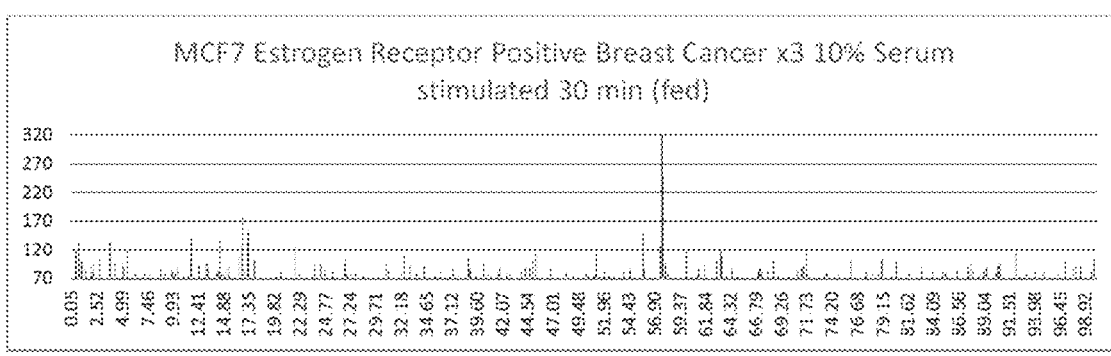
Figure 12C:
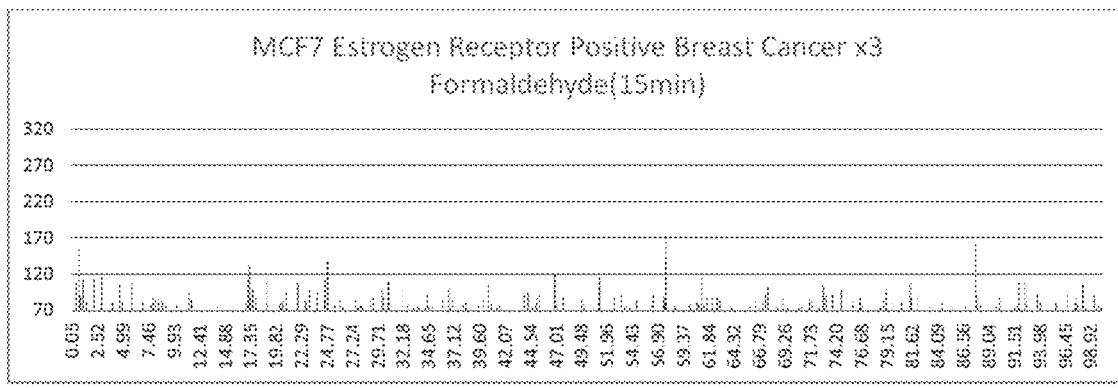
Figure 12D:
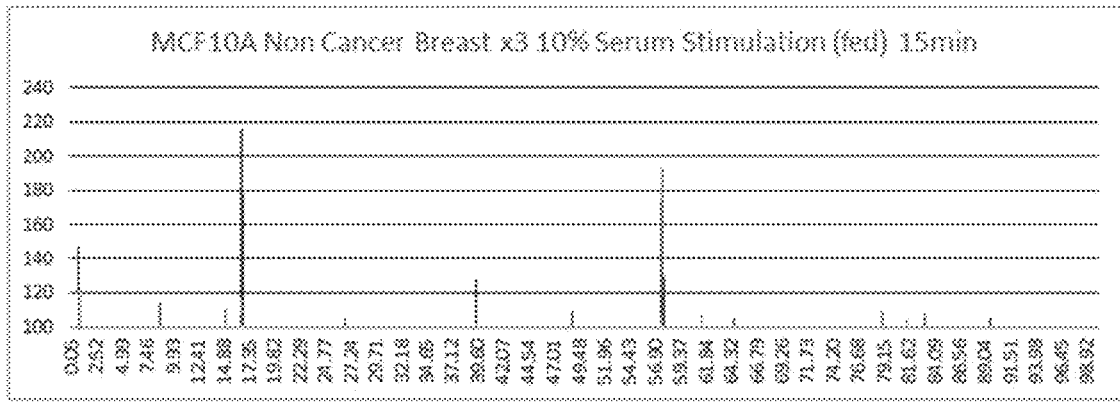
FIG. 12D-F shows the transition between MCF10A non-cancer breast cells in a 10% serum-added state after 15 mins (FIG. 12D), then in a 10% serum-added state after 30 mins (FIG. 12E), then a kill state with formaldehyde-fixation after 15 mins (FIG. 12F). X axis is frequency bins 0 Hz to 100 Hz. Y axis is the total event count for each frequency over time, in accordance with the present disclosure.
Figure 12E:
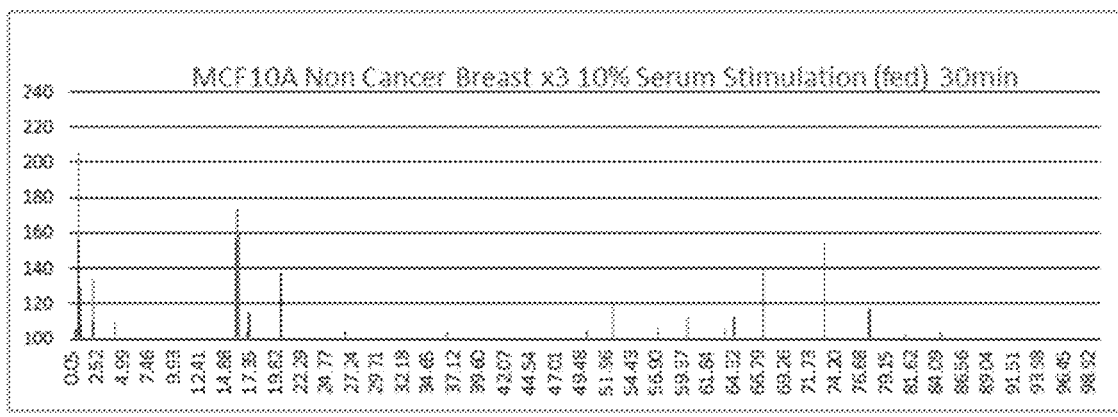
Figure 12F:
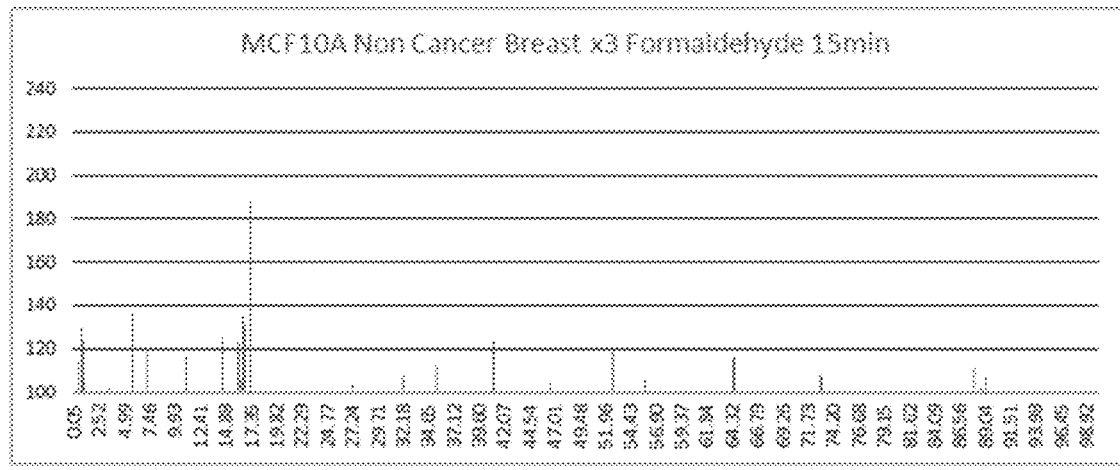
Figure 13A:
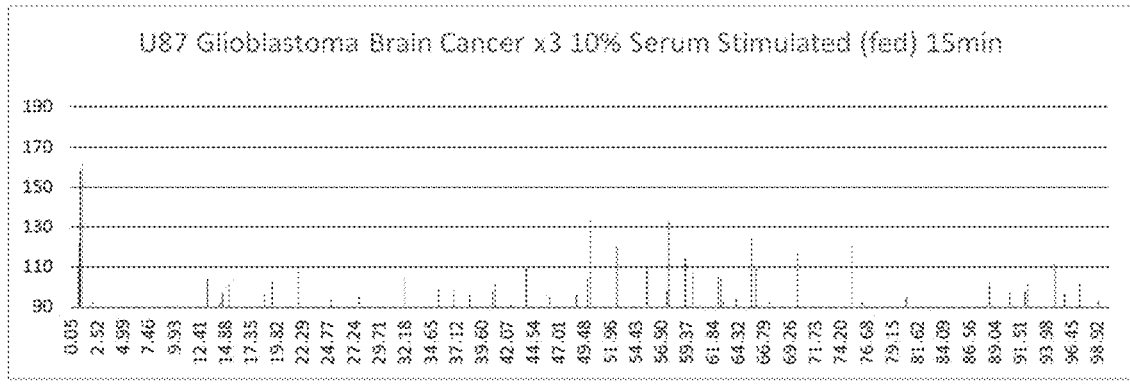
FIG. 13A-C shows the transition between U87 Glioblastoma brain cancer cells in a 10% serum-added state after 15 mins (FIG. 13A), then in a formaldehyde-fixation state after 5 mins (FIG. 13B). 10B1 non-cancer brain cells in a kill state with formaldehyde-fixation after 5 mins (FIG. 13C). X axis is frequency bins 0 Hz to 100 Hz. Y axis is the total event count for each frequency over time, in accordance with the present disclosure.
Figure 13B:
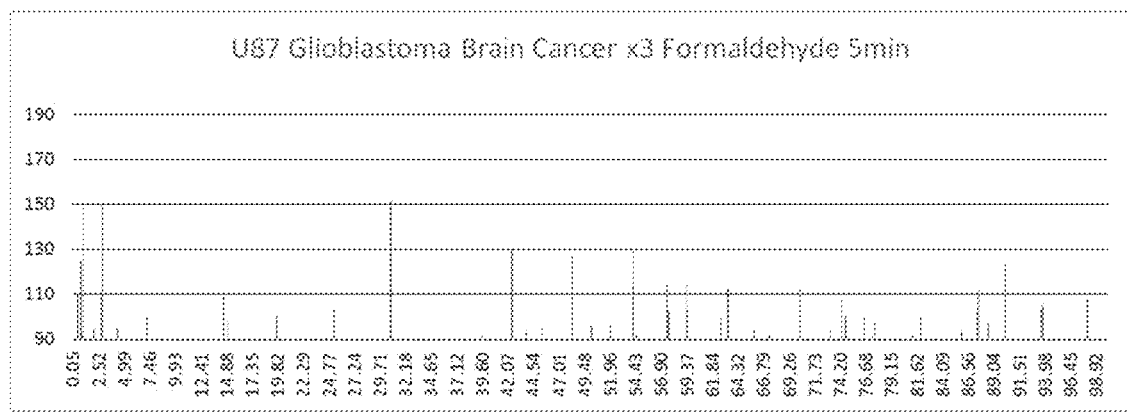
Figure 13C:
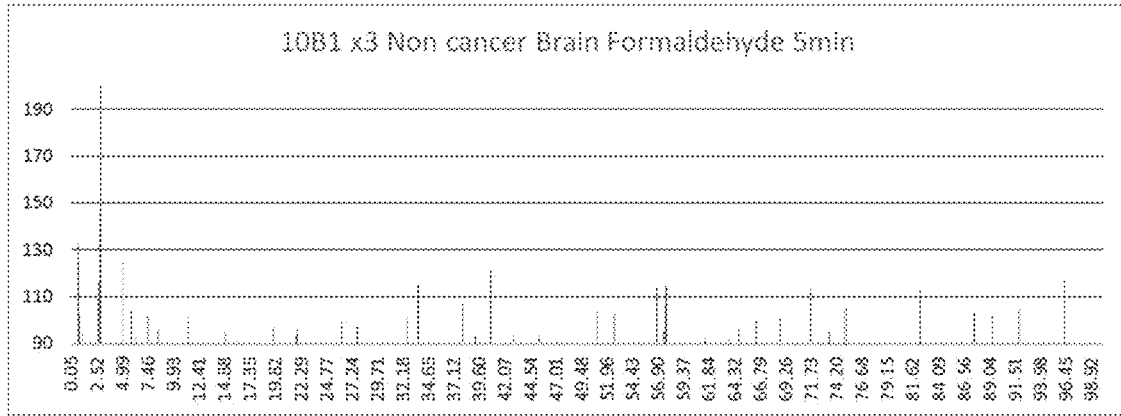
Figure 14A:
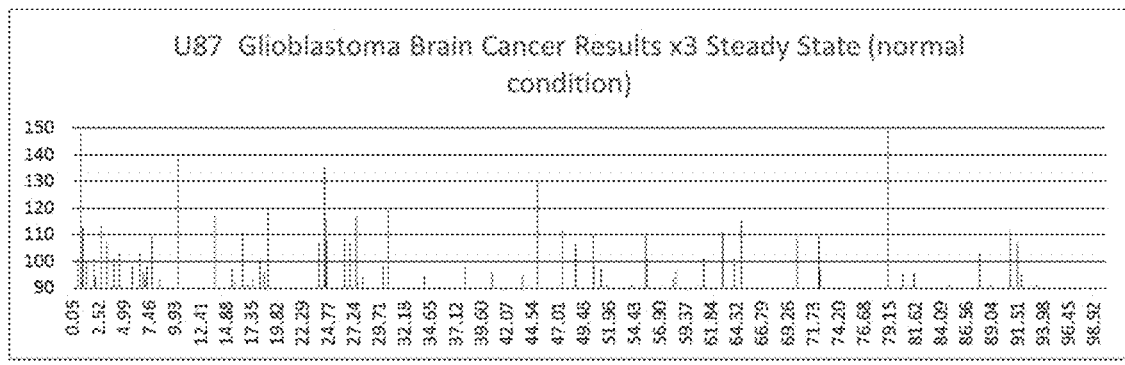
FIG. 14A-B shows the transition between U87 Glioblastoma brain cancer cells in normal growth conditions (FIG. 14A). 10B1 non-cancer brain cells in normal growth conditions (FIG. 14B). X axis is frequency bins 0 Hz to 100 Hz. Y axis is the total event count for each frequency over time, in accordance with the present disclosure.
Figure 14B:
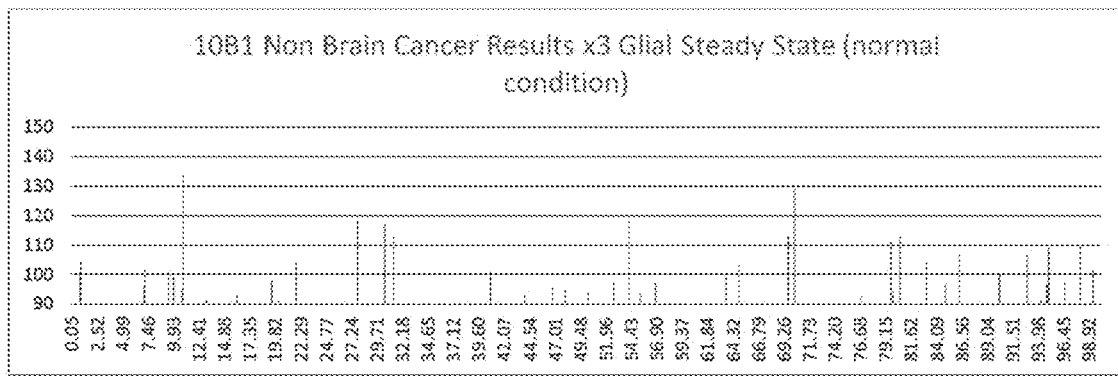

Various data processing methods and other operations described thus far can be implemented, for example, using one or more well-known computer systems, such as computer system 1100 shown in FIG. 11. The computer system 1100 may be an example of any of the computers described above with regards to signal processing or signal representation.

Computer system 1100 includes one or more processors (also called central processing units, or CPUs), such as a processor 1104. Processor 1104 can be connected to a communication infrastructure or bus 1106. The processor 1104 can be a field programmable gate array (FPGA). In another example, processor 1104 can be a digital signal processor (DSP).

One or more processors 1104 may each be a graphics processing unit (GPU). A GPU is a processor that is a specialized electronic circuit designed to rapidly process mathematically intensive applications on electronic devices. The GPU may have a highly parallel structure that is efficient for parallel processing of large blocks of data, such as mathematically intensive data common to computer graphics applications, images and videos.

Computer system 1100 can also include user input/output device(s) 1103, such as monitors, keyboards, pointing devices, etc., which communicate with communication infrastructure 1106 through user input/output interface(s) 1102.

Computer system 1100 can include a main or primary memory 1108, such as random access memory (RAM). Main memory 1108 may include one or more levels of cache. Main memory 1108 has stored therein control logic (i.e., computer software) and/or data.

Computer system 1100 can also include one or more secondary storage devices or memory 1110. Secondary memory 1110 can include, for example, a hard disk drive 1112 and/or a removable storage device or drive 1114. Removable storage drive 1114 can be a floppy disk drive, a magnetic tape drive, a compact disc drive, an optical storage device, tape backup device, and/or any other storage device/drive.

Removable storage drive 1114 can interact with a removable storage unit 1118. Removable storage unit 1118 includes a computer usable or readable storage device having stored thereon computer software (control logic) and/or data. Removable storage unit 1118 may be a floppy disk, magnetic tape, compact disc, Digital Versatile Disc (DVD), optical storage disk, solid state hard drive, memory stick and/or any other computer data storage device or cloud memory. Removable storage drive 1114 reads from and/or writes to removable storage unit 1118 in a well-known manner.

Secondary memory 1110 can include other means, instrumentalities, or approaches for allowing computer programs and/or other instructions and/or data to be accessed by computer system 1100. Such means, instrumentalities or other approaches can include, for example, a removable storage unit 1122 and an interface 1120. Examples of the removable storage unit 1122 and the interface 1120 can include a program cartridge and cartridge interface (such as that found in video game devices), a removable memory chip (such as an EPROM or PROM) and associated socket, a memory stick and universal serial bus (USB) port, a memory card and associated memory card slot, and/or any other removable storage unit and associated interface.

Computer system 1100 can further include a communication or network interface 1124. Communication interface 1124 enables computer system 1100 to communicate and interact with any combination of remote devices, remote networks, remote entities, etc. (individually and collectively referenced by reference number 1128). For example, communication interface 1124 can allow computer system 1100 to communicate with remote devices 1128 over communications path 1126, which may be wired and/or wireless, and which may include any combination of local area networks (LANs), wide area networks (WANs), the Internet, etc. Control logic and/or data can be transmitted to and from computer system 1100 via communication path 1126. Other computer architectures can be employed, as would become apparent to a person skilled in the art.

A tangible apparatus or article of manufacture comprising a tangible computer useable or readable medium having control logic (software) stored thereon is also referred to herein as a computer program product or program storage device. This includes, but is not limited to, computer system 1100, main memory 1108, secondary memory 1110, and removable storage units 1118 and 1122, as well as tangible articles of manufacture embodying any combination of the foregoing. Such control logic, when executed by one or more data processing devices (such as computer system 1100), causes such data processing devices to operate as described herein.

Results from Cellular Vibrational Spectra Analyzation Machine

Over a six month period, the inventors made measurements utilizing a new technology cell machine and Precision Measuring Matrix (PMM) proprietary software to systematically measure baseline noise floors, both cancerous and non-cancerous cells and those cells after the introduction of media, drugs and formaldehyde. The two main cell types that were analyzed included estrogen positive breast cancer cells and glioblastoma brain cancer cells. The graphs in FIGS. 12A-12F, 13A-13C, 14A-14B illustrate measurements of counts of specific frequency events (the sonic spectra) over 60 second time periods with a frequency range of 100 hertz in 0.10 hertz increments. Different colors on the graphs are different measurements in the same session. The sonic spectra of each type of cell is remarkably different. Cancer cells often produced higher amplitude spectra than non-cancer cells. The inventors have evidenced that the sonic spectra/frequencies produced by the cells is dynamic over time. What is viewed in this is static data over 60 second periods (not the eventual time order of the frequency event sonic spectra). When cells are given specific drugs, and/or starved for 24 hours, then fed growth factors including insulin, TNF and hormones, they react with higher amplitude sonic spectra/vibrations/frequencies. Consistently when formaldehyde was introduced to the cells, the inventors witnessed and measured the slow deterioration of the vibrational energy.

Moreover, HL-1 cardiomyocyte cells were induced to beat in culture and the machine recorded the vibration of these contractions generated by the myocytes, and this signal decreased as a function of distance from the beam. The average frequencies 0.93 Hz was derived by video imaging and determination of contractions, yet the machine could obtain the beat frequency as well as the harmonic values which resulted. The use of an orthogonal technique herein provides evidence demonstrating the capability of the machine to obtain expected results as well as novel harmonic values.

Non-Limiting Disclosure Clauses:

The system/method can be used to study living cells/tissue in vivo, such that even extended observations do not cause any harm to the cells.

The system/method can use a laser as the photon beam source with a wavelength of about 500 nm.

The system/method can uses a "single pixel" photon-detector, based on a high-sensitivity photomultiplier streamed electron output that can operate at high frequencies.

The system/method can have a first analysis module to characterize time, frequency, and amplitude of the signal.

The system/method can include a low noise power supply to power the photon beam source.

The system/method can have an optional auxiliary signal injection element to assist with noise reduction for the bias and gain adjustment and amplifier. And a switch can be used to turn signal injection element on and off.

Wherein an optional time code module is included for tracking an optional movie and/or video, the stimuli and the characterized results simultaneously.

Wherein the PMM (or other time/frequency/amplitude software) is used to create a 3D matrix of outputs and/or histograms, and/or characterization data based on filtering of the events created from the digital signal stream.

Wherein a DC offset and bias can be adjusted to align the measured (cell modulated) and reference signals, using techniques described in the above patents incorporated by reference.

Wherein multiple detectors and/or filters can be used simultaneously.

Wherein modulation of the light intensity in a controlled fashion either through a phase lock loop or by other means can be used to improve the data extracted from the measurements, in particular to improve the signal to noise ratio.

Conclusion

Based on the teachings contained in this disclosure, it will be apparent to persons skilled in the relevant art(s) how to make and use the invention using data processing devices, computer systems and/or computer architectures other than that shown in FIG. 10. Such can be accomplished with software, hardware, and/or operating system implementations other than those described herein, as well as combinations thereof.

It is to be understood that while certain aspects of the invention(s) have been illustrated and described herein, the claims are not to be limited to the specific forms or arrangement of parts described and shown. Modifications and variations of the invention(s) are possible in light of the above teachings. It is therefore to be understood that the invention(s) may be practiced otherwise than as specifically described.

What is claimed is:

1. A system for measuring vibrational spectra of living tissue, comprising:
 a photon source configured to output a single photon beam;
 a support device configured to support living tissue and to allow the single photon beam to pass through the living tissue, wherein cellular motion of the living tissue varies an amount of the single photon beam that is blocked, absorbed, or deflected, thereby directly modulating the single photon beam as it passes through the living tissue;
 a detector configured to directly detect the modulated single photon beam that passed through and was directly modulated by the cellular motion of the living tissue and to produce an analog signal representative of the cellular motion, at least a portion of the detector located on a different side of the support device from the photon source;
 an analog-to-digital converter configured to receive the analog signal and output a digital representation of the cellular motion; and
 a digital signal processor configured to:
  map the digital representation of the cellular motion to partials, each partial representing an amplitude specified over a narrow range of time and frequency;
  chain the partials into events, which are collections of partials localized in time and frequency and having similar topological properties; and
  characterize the events into one or more of vibrational spectra and discrete frequencies of the living tissue cellular motion over time,
 wherein the analog signal representative of the cellular motion of the living tissue is based on the modulated single photon beam, and
 wherein the modulated single photon beam is non-interferometric.

2. The system of claim 1, wherein the digital signal processor performs the mapping, chaining, and characterizing using a precision measuring matrix.

3. The system of claim 1, wherein the digital signal processor performs the mapping, chaining, and characterizing using Fourier transforms.

4. The system of claim 1, wherein the digital signal processor performs the mapping, chaining, and characterizing using wavelet transforms.

5. The system of claim 1, wherein at least one sub-cellular structure of the living tissue has a fluorescent marker, such that the living tissue modulates the single photon beam thereby causing the at least one sub-cellular structure to emit photons at a wavelength longer than the wavelength of the single photon beam, and the system further comprises a filter to pass only the emitted photons associated with the at least one sub-cellular structure.

6. A method for measuring vibrational spectra of living tissue, comprising:
 generating a single photon beam using an optical source;
 directing the single photon beam through the living tissue, wherein the living tissue directly blocks, absorbs, or deflects portions of the single photon beam, thereby directly modulating the single photon beam passing through the living tissue;
 receiving at a photon detector the modulated single photon beam that passed through and was directly modulated by the cellular motion of the living tissue, wherein the photon detector outputs an analog signal representing the modulated single photon beam, wherein the modulated single photon beam is non-interferometric;
 converting the analog signal into a digital signal;
 mapping the digital signal to a plurality of partials, the plurality of partials being associated with amplitudes over given frequency ranges and time periods;
 chaining the plurality of partials into a plurality of events localized over the given frequency ranges and time periods; and
 generating vibrational spectra associated with the living tissue for a range of events provided over a time period.

7. The method of claim 6, wherein the mapping, chaining, and generating comprises using a precision measuring matrix.

8. The method of claim 6, wherein the mapping, chaining, and generating comprises using Fourier transforms.

9. The method of claim 6, wherein the mapping, chaining, and generating comprises using wavelet transforms.

10. The method of claim 6, wherein at least one sub-cellular structure of the living tissue has a fluorescent marker, wherein the living tissue modulates the single photon beam passing through the living tissue, thereby causing the at least one sub-cellular structure to emit photons at a wavelength longer than the wavelength of the single photon beam, and the method further comprises filtering to pass only the emitted photons associated with the at least one sub-cellular structure.

11. A system for measuring vibrational spectra of living tissue, comprising:
a photon source configured to output a single photon beam;
a support device configured to support living tissue and to allow the single photon beam to pass through the living tissue, wherein cellular motion of the living tissue directly varies an amount of the single photon beam that is blocked, absorbed, or deflected, thereby directly modulating the single photon beam as it passes through the living tissue;
a detector configured to detect the modulated portion of the single photon beam that passed through and was directly modulated by the cellular motion of the living tissue and to produce an analog signal representative of the cellular motion;
an analog-to-digital converter configured to receive the analog signal and output a digital representation of the modulated portion of the single photon beam; and
a digital signal processor configured to:
map the digital representation of the modulated single photon beam to partials, each partial representing an amplitude specified over a narrow range of time and frequency; and
characterize the partials into one or more of vibrational spectra and discrete frequencies of the living tissue over time,
wherein the analog signal representative of the cellular motion of the living tissue is based on the modulated single photon beam, and
wherein the modulated single photon beam is non-interferometric.

12. The system of claim 11, wherein the digital signal processor performs the mapping and characterizing using a precision measuring matrix.

13. The system of claim 11, wherein the digital signal processor performs the mapping and characterizing using Fourier transforms.

14. The system of claim 11, wherein the digital signal processor performs the mapping and characterizing using wavelet transforms.

15. The system of claim 11, wherein the characterizing further comprises:
chaining the partials into events, which are collections of partials localized in time and frequency and having similar topological properties; and
characterizing the events into the one or more of vibrational spectra and discrete frequencies of the living tissue over time.

16. The system of claim 11, wherein at least one sub-cellular structure of the living tissue has a fluorescent marker, such that the living tissue modulates the single photon beam passing through the living tissue thereby causing the at least one sub-cellular structure to emit photons at a wavelength longer than the wavelength of the single photon beam, and the system further comprises a filter to pass only the emitted photons associated with the at least one sub-cellular structure.

17. A system for measuring vibrational spectra of living tissue, comprising:
a photon source configured to output a single photon beam;
a support device configured to support living tissue and to allow the single photon beam to pass through the living tissue, wherein cellular motion of the living tissue directly varies an amount of the single photon beam that is blocked, absorbed, or deflected, thereby directly modulating a remaining portion of the single photon beam passing through the living tissue;
a detector configured to detect the modulated remaining portion of the single photon beam and produce an analog signal;
an analog-to-digital converter configured to receive the analog signal and output a digital representation of the modulated remaining portion of the single photon beam; and
a non-transitory computer readable medium comprising processor readable instructions which, when run on a processor controlled apparatus, cause the processor controlled apparatus to analyze the digital representation of the modulated remaining portion of the single photon beam to create one or more of vibrational spectra and discrete frequencies of the living tissue over time,
wherein the analog signal is based on the modulated remaining portion of the single photon beam, and
wherein the modulated remaining portion of the single photon beam is non-interferometric.

18. The system of claim 17, wherein the computer readable medium is further configured to map the digital representation of the modulated remaining portion of the single photon beam to partials, each partial representing an amplitude specified over a narrow range of time and frequency.

19. The system of claim 17, wherein the computer readable medium is further configured to chain events, which are collections of partials localized in time and frequency and having similar topological properties.

20. The system of claim 19, wherein the computer readable medium is further configured to characterize the events into one or more of vibrational spectra and discrete frequencies of the living tissue over time.

21. The system of claim 17, wherein at least one sub-cellular structure of the living tissue has a fluorescent marker, such that the living tissue modulates the single photon beam passing through the living tissue thereby causing the at least one sub-cellular structure to emit photons at a wavelength longer than the wavelength of the single photon beam, and the system further comprises a filter to pass only the emitted photons associated with the at least one sub-cellular structure.

* * * * *